(12) United States Patent
Matsuno et al.

(10) Patent No.: US 7,194,719 B2
(45) Date of Patent: Mar. 20, 2007

(54) BASIC CELL, EDGE CELL, WIRING SHAPE, WIRING METHOD, AND SHIELD WIRING STRUCTURE

(75) Inventors: Noriaki Matsuno, Hyogo (JP); Masato Tsunoda, Kyoto (JP); Hirofumi Wada, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 283 days.

(21) Appl. No.: 10/914,334

(22) Filed: Aug. 10, 2004

(65) Prior Publication Data

US 2005/0050507 A1   Mar. 3, 2005

(30) Foreign Application Priority Data

Aug. 28, 2003  (JP)  ............................. 2003-305392
Jun. 22, 2004  (JP)  ............................. 2004-183810

(51) Int. Cl.
*G06F 17/50* (2006.01)

(52) U.S. Cl. .............................. 716/12; 716/8; 716/13; 716/14; 716/17

(58) Field of Classification Search ................. 716/17, 716/14, 13, 12, 8
See application file for complete search history.

(56) References Cited

U.S. PATENT DOCUMENTS

| | | | |
|---|---|---|---|
| 5,406,630 A | | 4/1995 | Piosenka et al. |
| 5,473,112 A | * | 12/1995 | Doi ............................. 174/376 |
| 5,986,284 A | | 11/1999 | Kusaba et al. |
| 6,166,440 A | * | 12/2000 | Yang ........................... 257/758 |
| 6,392,259 B1 | | 5/2002 | Allinger et al. |
| 6,496,119 B1 | | 12/2002 | Otterstedt et al. |
| 2002/0126792 A1 | * | 9/2002 | Fuhrmann et al. ............. 377/1 |
| 2003/0063697 A1 | * | 4/2003 | Itoh ........................... 375/356 |

FOREIGN PATENT DOCUMENTS

| | | |
|---|---|---|
| JP | 5-47766 | 2/1993 |
| JP | 11-177029 | 7/1999 |
| JP | 2000-101030 | 4/2000 |
| JP | 2001-24158 | 1/2001 |
| JP | 2001-244414 A | 9/2001 |
| JP | 2002-216093 A | 8/2002 |
| JP | 2002-529928 | 9/2002 |
| JP | 2002-319010 A | 10/2002 |
| JP | 2003-007824 A | 1/2003 |
| JP | 2003-110025 A | 4/2003 |

OTHER PUBLICATIONS

Das et al., "Manhattan-Diagonal Routing in Channels and Switchboxes", Jan. 2004, ACM Transaction on Design Automation of Electronic Systems, vol. 9, No. 1, pp. 75-104.*

* cited by examiner

*Primary Examiner*—Sun James Lin
(74) *Attorney, Agent, or Firm*—McDermott Will & Emery LLP

(57) ABSTRACT

A basic cell of the present invention comprises a plurality of wires which constitute a wiring route of 90°, one ends of the plurality of wires being on one of opposite sides, and the other ends of the plurality of wires being on the other one of the opposite sides, wherein: each of the one ends of the plurality of wires is point-symmetric to any of the other ends of the plurality of wires with respect to the center of the area of the basic cell; and routes of the plurality of wires do not cross one another.

17 Claims, 29 Drawing Sheets

Even-numbered rows

Odd-numbered rows

BASIC CELL, EDGE CELL, WIRING SHAPE, WIRING METHOD, AND SHIELD WIRING STRUCTURE

CROSS-REFERENCE TO RELATED APPLICATIONS

This application claims priority under 35 U.S.C. §119(a) on Japanese Patent Application No. 2003-305392 filed on Aug. 28, 2003 and Japanese Patent Application No. 2004-183810 filed on Jun. 22, 2004, the entire contents of which are hereby incorporated by reference.

BACKGROUND OF THE INVENTION

1. Field of the Invention

The present invention relates to a shield wiring technique which increases the difficulty of physically analyzing a semiconductor chip to prevent fraudulent reading and tampering of security information.

2. Background Art

In recent years, circuitry information and internal information of semiconductor devices have required a considerably high level of confidentiality and secrecy. Especially in the field of IC cards, the safety of semiconductor devices is an essential feature and, therefore, it is necessary to protect important information from fraudulent analysis and prevent tampering and copying of internal information. In view of such, there has been a technique for shield wiring in the uppermost wiring layer such that a mask pattern is hidden in order to prevent reading of a mask pattern and circuit analysis with a probe on a wire which may be performed for the purpose of copying and tampering of a semiconductor chip.

SUMMARY OF THE INVENTION

However, a region to be shielded extends over the entire chip area, and therefore, manual wiring is impossible in view of the man-hour. Further, an automatic wiring tool cannot place wires all over a chip area such that no free space is left.

A basic cell of the present invention comprises a plurality of wires which constitute a wiring route of 90°, one ends of the wires being on one of opposite sides, and the other ends of the wires being on the other one of the opposite sides, wherein: each of the one ends of the wires is point-symmetric to any of the other ends of the wires with respect to the center of the area of the basic cell; and routes of the plurality of wires do not cross one another.

Another basic cell of the present invention comprises a plurality of wires which constitute wiring routes of 45° and 90°, wherein: each of one ends of the wires is point-symmetric to any of the other ends of the wires with respect to the center of the area of the basic cell; and routes of the plurality of wires do not cross one another.

A wiring method of the present invention comprises the steps of: preparing a plurality of aforementioned basic cells, the basic cells having different wiring routes; and arranging the prepared basic cells such that one ends or the other ends of a plurality of wires included in one of the prepared basic cells abut one ends or the other ends of a plurality of wires included in another one of the prepared basic cells, thereby forming a wiring.

The wiring pattern of every other one of a plurality of basic cells arranged in a row direction may be inverted with respect to the Y-axis including the origin point of the basic cell. Herein, the row direction means such a direction that a connection point of each of basic cells aligned in said direction abuts a connection point of an adjacent cell.

In the above wiring method, if a basic cell is used where one ends and the other ends of a plurality of wires are placed at symmetrical positions on one and the other of opposite sides, the wiring pattern of any of the arranged basic cells is inverted with respect to the Y-axis including the origin point of the basic cell.

An edge cell of the present invention is a pattern for turn-around connection at a wiring route edge portion, comprising terminals arranged on only one side of the edge cell at positions corresponding to terminal positions of basic cells which are arranged side by side and connected to the edge cell, wherein: the arranged terminals are brought into correspondence with one another from both ends toward the center on a one-to-one basis; and a wire is provided in the form of a route of 90° between the corresponding terminals.

In the above wiring method, if there are two or more rows of arranged basic cells, a turn-around connection is formed at a wiring route edge portion by using the aforementioned edge cell.

A wiring shape of the present invention comprises a stepped wiring route at least in a part of a wiring route formed by a diagonal route, the stepped wiring route being formed by vertically-extending wires and horizontally-extending wires.

A wiring structure of a shielding line of the present invention comprises: a first shielding line superposed entirely over a wiring to be protected; and a second shielding line formed in a layer overlying the first shielding line.

Another wiring structure of a shielding line of the present invention comprises: a shielding line layer in which a circuit line is partially mixed, the shielding line layer being formed in the uppermost layer of a semiconductor device; and at least one intermediate layer in which a dummy line is inserted in a free space, the at least one intermediate layer being provided between a semiconductor substrate and the shielding line layer, wherein the dummy line is connected to a line in an underlying layer to form wiring bridges in some portions.

Still another basic cell of the present invention comprises a plurality of wires which constitute a wiring route of 45° or 90°, one ends of the wires being on one of opposite sides, and the other ends of the wires being on the other one of the opposite sides, wherein: each of the plurality of the wires is formed by a straight route between one end and the other end; and the plurality of wires are parallel to one another.

Another wiring method of the present invention comprises the steps of: preparing a plurality of aforementioned basic cells; and arranging the prepared basic cells such that one ends or the other ends of a plurality of wires included in one of the prepared basic cells abut one ends or the other ends of a plurality of wires included in another one of the prepared basic cells, thereby forming a wiring.

Still another wiring structure of the present invention comprises a wiring route which includes a plurality of wires of 45° or 90°, wherein the plurality of wires are parallel to one another and include no turn-around portion.

Another edge cell of the present invention is a pattern for turn-around connection at a wiring route edge portion, comprising terminals arranged on only one side of the edge cell at positions corresponding to terminal positions of the aforementioned basic cells which are arranged side by side, wherein each of the terminals is connected to any one of the other arranged terminals except for an adjacent terminal.

Preferably, in the above wiring method, if there are two or more rows of arranged basic cells, a turn-around connection is formed at a wiring route edge portion by using one or a plurality of aforementioned edge cells.

Preferably, in the above wiring method, the turn-around connection is formed at the wiring route edge portion using a plurality of edge cells having different relationships of connection between terminals.

Still another wiring structure of the present invention comprises a plurality of wires in which a turn-around connection is formed at a route edge portion, wherein each of the plurality of wires is adjacent to a wire of a different route of the plurality of wires.

According to the present invention, a plurality of wiring patterns each having a small area are prepared, and selection and arrangement of the wiring patterns are randomly performed, whereby shielding wires of low regularity, which is different from a simple array configuration, can be generated.

In a conventional shielding line, a route adjoins itself at a turn-around portion of a shield route. Thus, in the case where circuit analysis is committed with a probe against a circuit line in a shielding line removed region where a shielding line is removed and a cut shielding line is connected to another route, a region including two or more routes of shielding lines can be analyzed within a unit of processing time required for connecting the cut shielding line to another route. On the other hand, according to the present invention, a basic cell including a plurality of routes that extend constantly in parallel to one another and an edge cell for turn-around connection in which no route adjoins itself are provided. Even if circuit analysis is committed with a probe against a circuit line in a shielding line removed region, such a structure of the present invention doubles the processing time required for analysis in a region including two or more routes of shielding lines. Accordingly, the processing difficulty increases.

Further, a plurality of edge cells having different relationships of connection between terminals are used, whereby a shielding line route having less regularity is formed although the wiring of the uppermost layer has a regular pattern. Thus, the difficulty level of circuit analysis increases.

DESCRIPTION OF THE PREFERRED EMBODIMENTS

Figure 1:
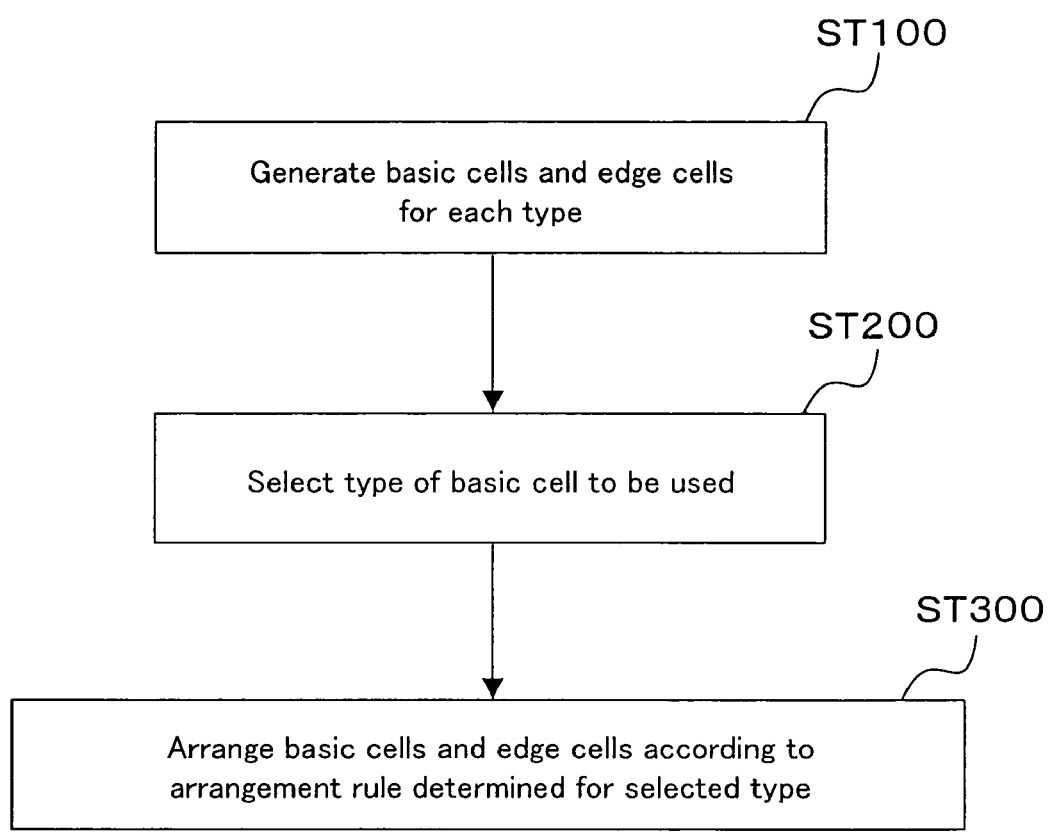
FIG. 1 shows a general procedure of a shielding line wiring method according to embodiment 1.

Hereinafter, embodiments of the present invention will be described in detail with reference to the drawings. Throughout the drawings, like or equivalent elements are denoted by like reference numerals, and therefore, descriptions thereof are not repeatedly provided.

Embodiment 1

FIG. 1 shows a general procedure of a shielding line wiring method according to embodiment 1. A shielding line is provided in the uppermost wiring layer to hide a mask pattern, whereby reading of the mask pattern and circuit analysis with a probe on wires, which are performed for the purpose of copying and tampering of a semiconductor chip, are prevented. In embodiment 1, a plurality of wiring patterns (basic cells) each having a small area are prepared, and selection and arrangement of the wiring patterns are performed on a random basis. It should be noted that, as a matter of course, adjoining basic cells may have the same pattern. With this feature, shielding wires of low regularity, which is different from a simple array configuration, can be generated. Generation of such shield wiring is described below in detail.

<Generation of Basic Cells and Edge Cells (ST100)>

Figure 2:
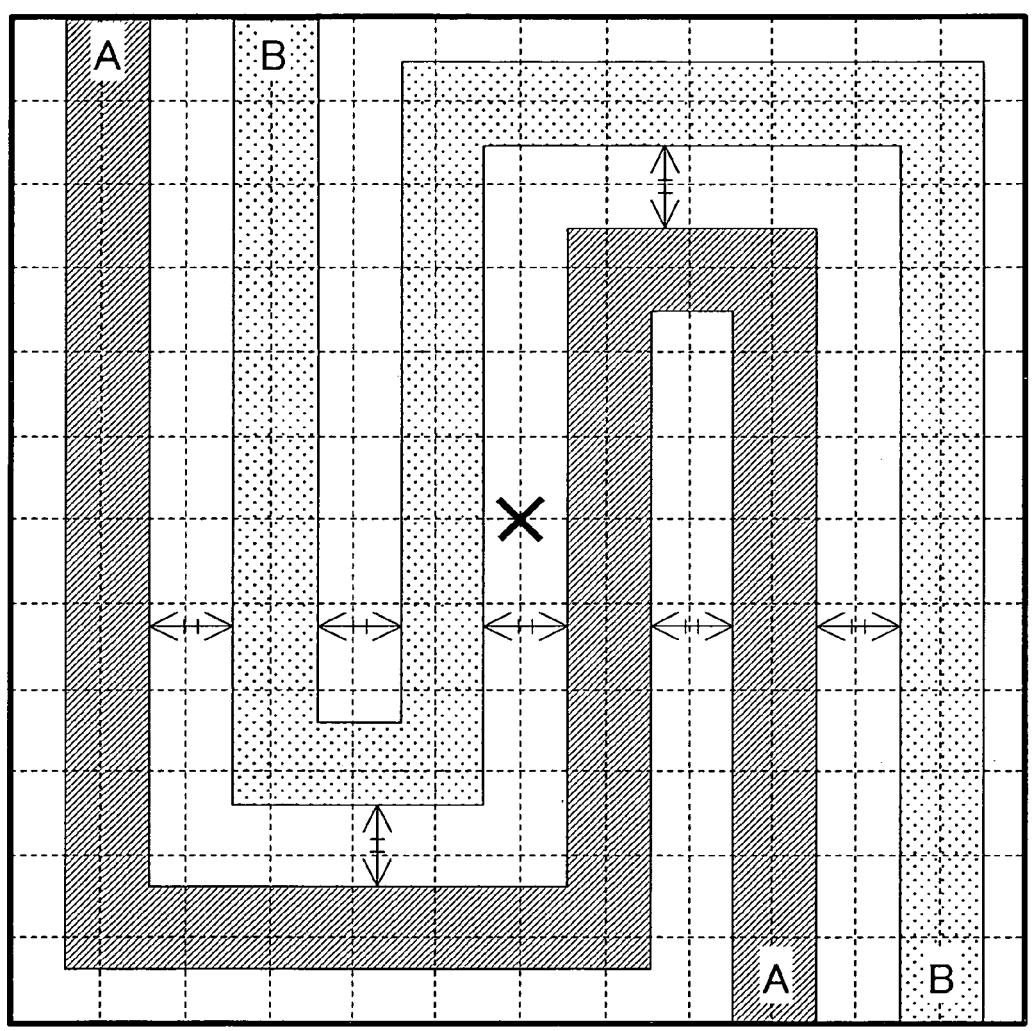
FIG. 2 shows an example of a basic cell.

First, a design rule of a wiring pattern (basic cell) which is a basic unit of shield wiring is described. FIG. 2 shows an example of a basic cell, which is provided for easy understanding of the design rule. Herein, the following design rule is provided for obtaining uniform wiring density:
External boundary of a pattern (basic cell) is rectangular;
All of the wiring intervals are equal;
The space between the wiring and the pattern external boundary is a ½ of the wiring interval; and
The origin point of the pattern is at the center of the area enclosed by the external boundary.

It should be noted that the rule value is determined based on the design rule according to the wiring occupancy rate, the capacity of a wiring prober, etc.

Basic cells are generated according to the above rule. Herein, the following 3 types of basic cells are generated:
90°-wiring arrangement type (1);
90°-wiring arrangement type (2); and
45°-wiring arrangement type.

Generation of each type of basic cells and edge cells is described below in detail.

<90°-Wiring Arrangement Type (1)>

Figure 3:
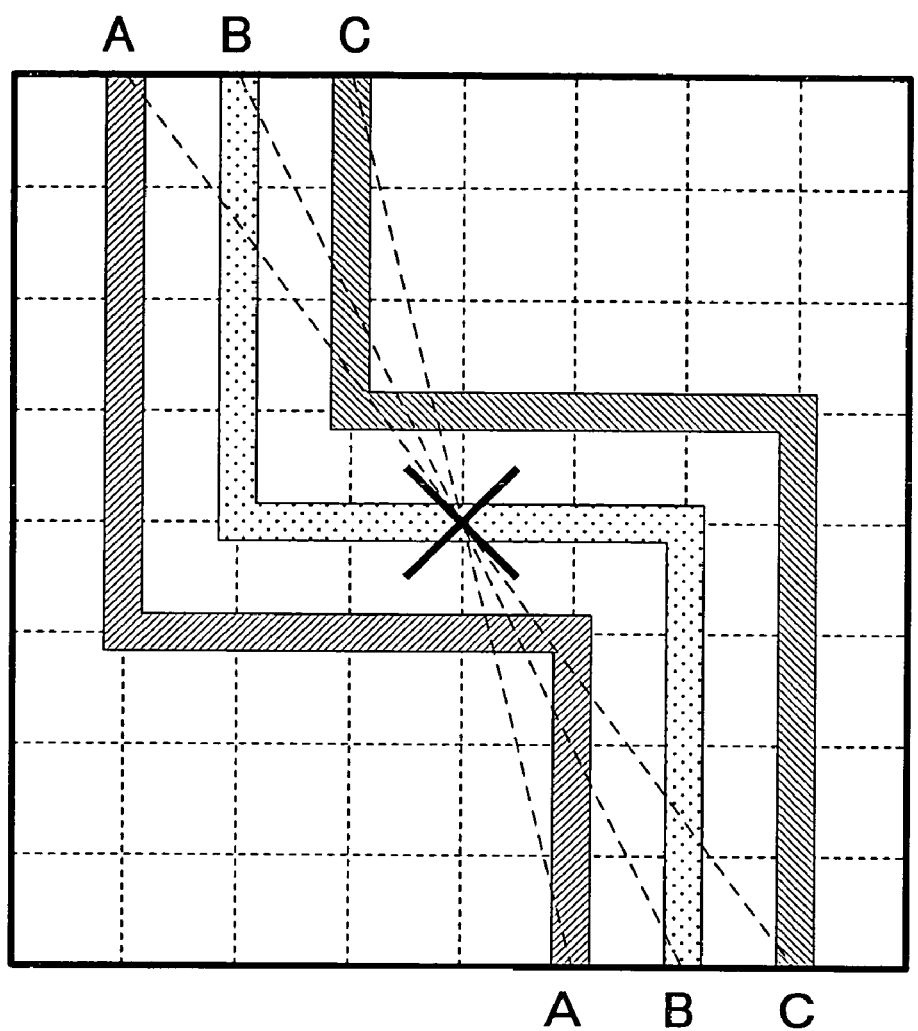
FIG. 3 illustrates a rule for determining a terminal position of a basic cell of 90°-wiring arrangement type (1).

In a basic cell of 90°-wiring arrangement type (1), as shown in FIG. 3, the wiring route is formed by 90°-routes (i.e., the wiring route runs in a direction which forms an angle of 90° with any one of the four edges of a chip), and the terminal positions are not at symmetrical positions. The positions of the terminals are determined according to the following rule:
The inlet end and outlet end of an wire are placed on opposite sides of the rectangular pattern area; and
The inlet ends and outlet ends of an wire are placed at symmetric positions with respect to the center of the pattern area (symbol "x" of FIG. 3), and the order of lines A, B and C at the inlet end is opposite to that at the outlet end.

Figure 4A:
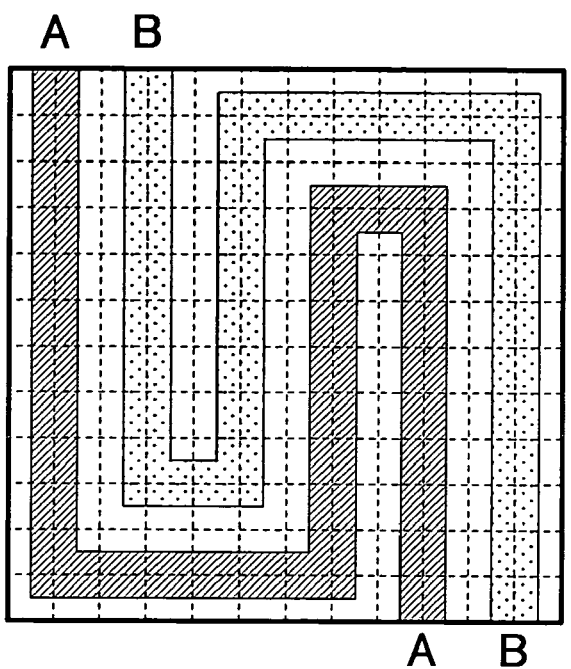
FIG. 4 shows an example of a basic cell of 90°-wiring arrangement type (1).
Figure 4B:
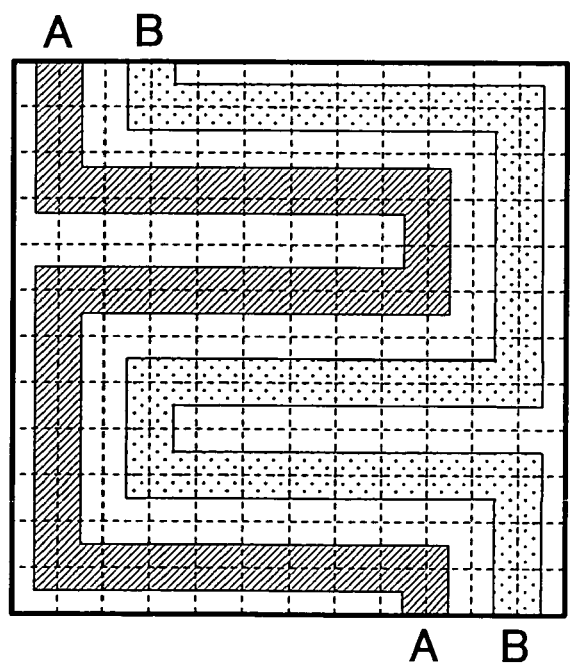
Figure 5A:
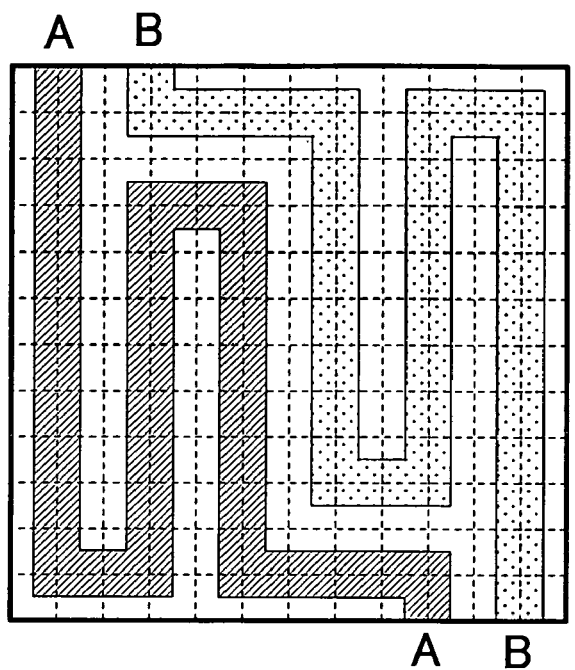
FIG. 5 shows another example of a basic cell of 90°-wiring arrangement type (1).
Figure 5B:
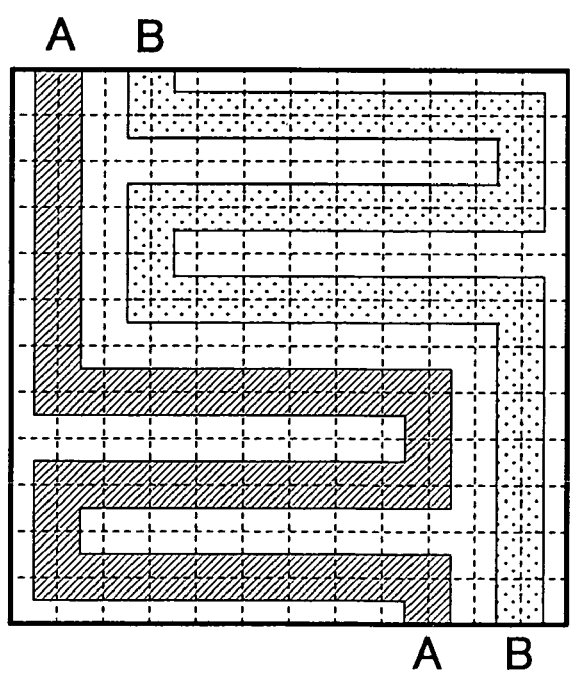
Figure 6A:
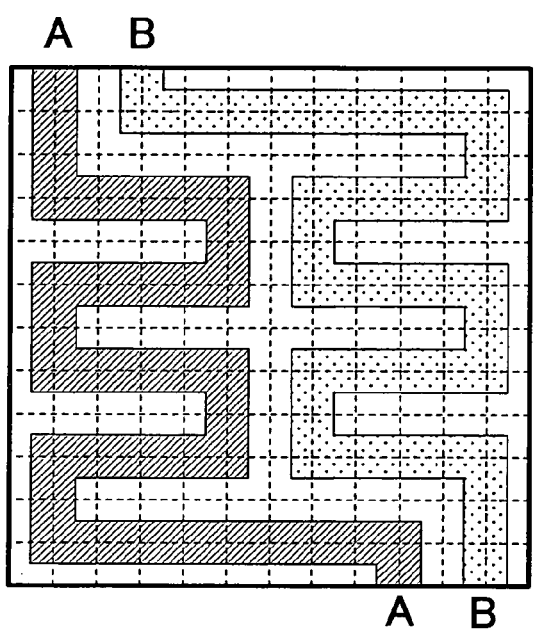
FIG. 6 shows still another example of a basic cell of 90°-wiring arrangement type (1).
Figure 6B:
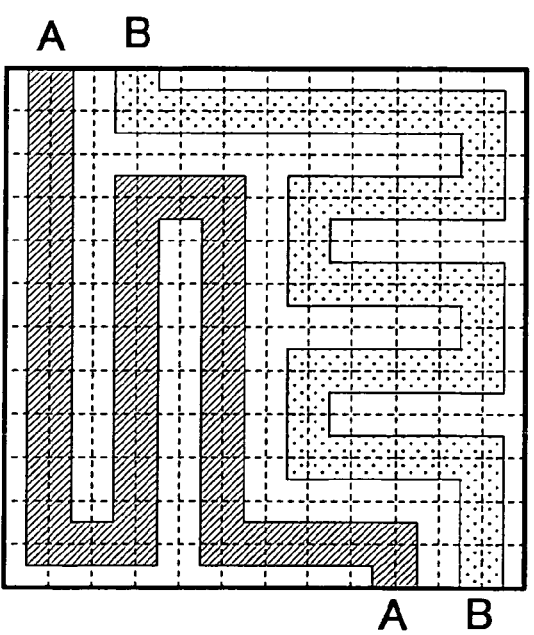

After the positions of the terminals have been determined, the inlet and the outlet for the same line are connected by a 90°-route. As a result, one basic cell is generated. By the same process, a plurality of basic cells having different terminal positions and different wiring routes are generated. Examples of the thus-generated basic cells of 90°-wiring arrangement type (1) are shown in FIGS. 4 to 6.

<90°-Wiring Arrangement Type (2)>

Figure 7A:
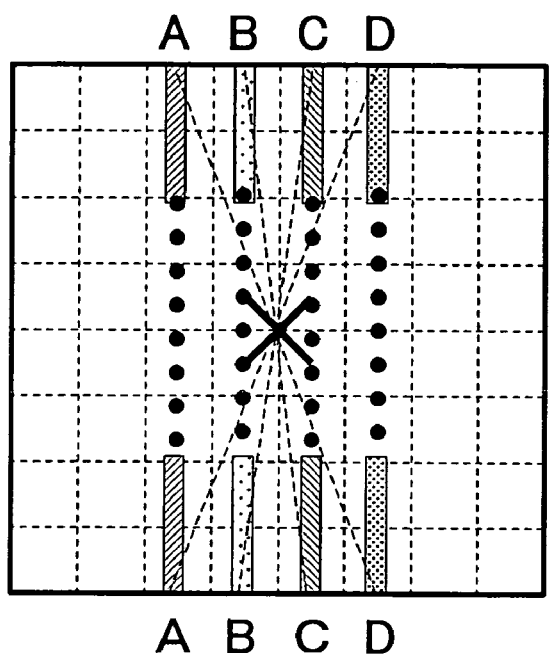
FIG. 7 illustrates a rule for determining a terminal position of a basic cell of 90°-wiring arrangement type (2).
Figure 7B:
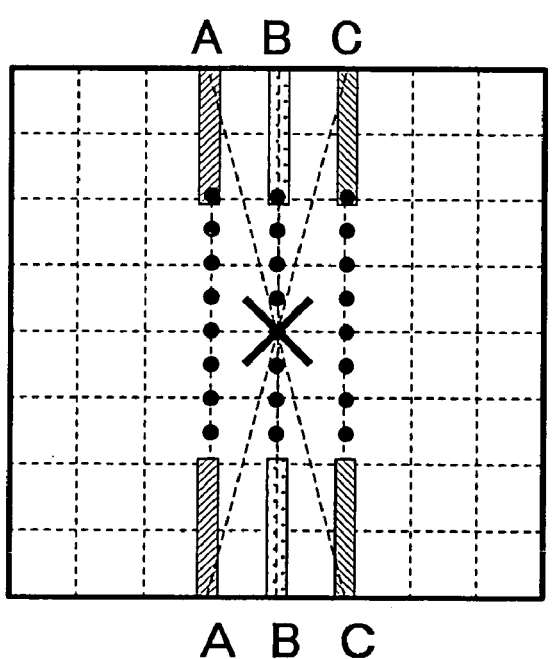

In a basic cell of 90°-wiring arrangement type (2), as shown in FIGS. 7A and 7B, the wiring route is formed by 90°-routes, and the terminal positions are at symmetrical positions. The positions of the terminals are determined according to the following rule:
The inlet end and outlet end of a wire are placed on opposite sides of the rectangular pattern area;
 The inlet ends and outlet ends of a wire are placed at symmetric positions with respect to the center of the pattern area (symbol "x" of FIG. 7), and the order of lines A, B, C and D at the inlet end is opposite to that at the outlet end; and
 The terminal positions on each side are at symmetrical positions with respect to Y-axis line including the origin point of the pattern area (symbol "x" of FIG. 7).

Figure 8A:
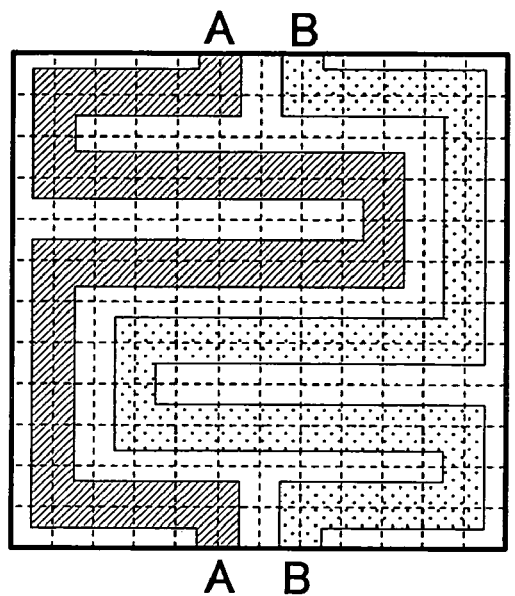
FIG. 8 shows an example of a basic cell of 90°-wiring arrangement type (2).
Figure 8B:
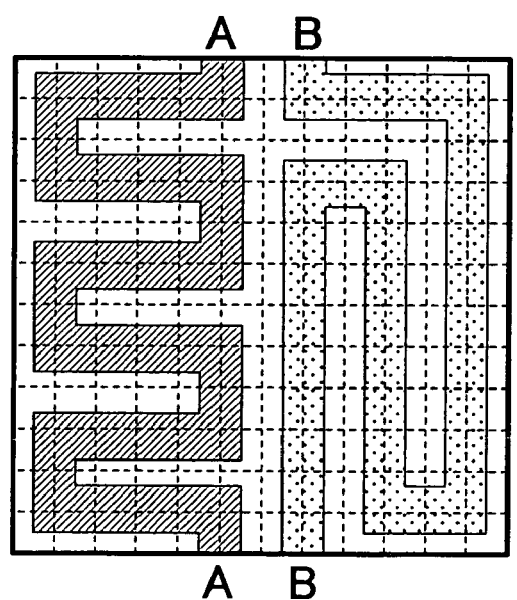
Figure 9:
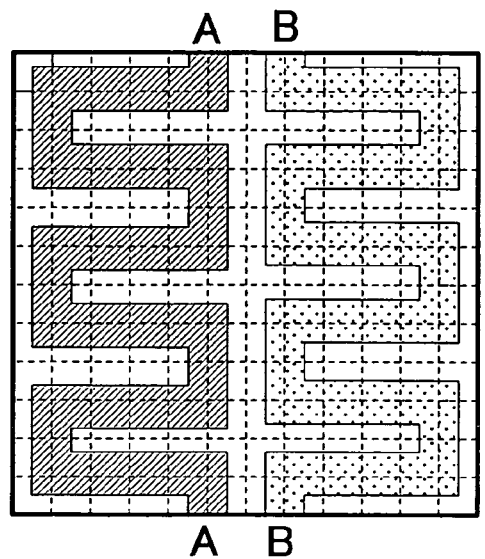
FIG. 9 shows another example of a basic cell of 90°-wiring arrangement type (2).

After the positions of the terminals have been determined, the inlet and the outlet for the same line are connected by a 90°-route. As a result, one basic cell is generated. By the same process, a plurality of basic cells having different terminal positions and different wiring routes are generated. Examples of the thus-generated basic cells of 90°-wiring arrangement type (2) are shown in FIGS. 8 and 9.

Figure 10:
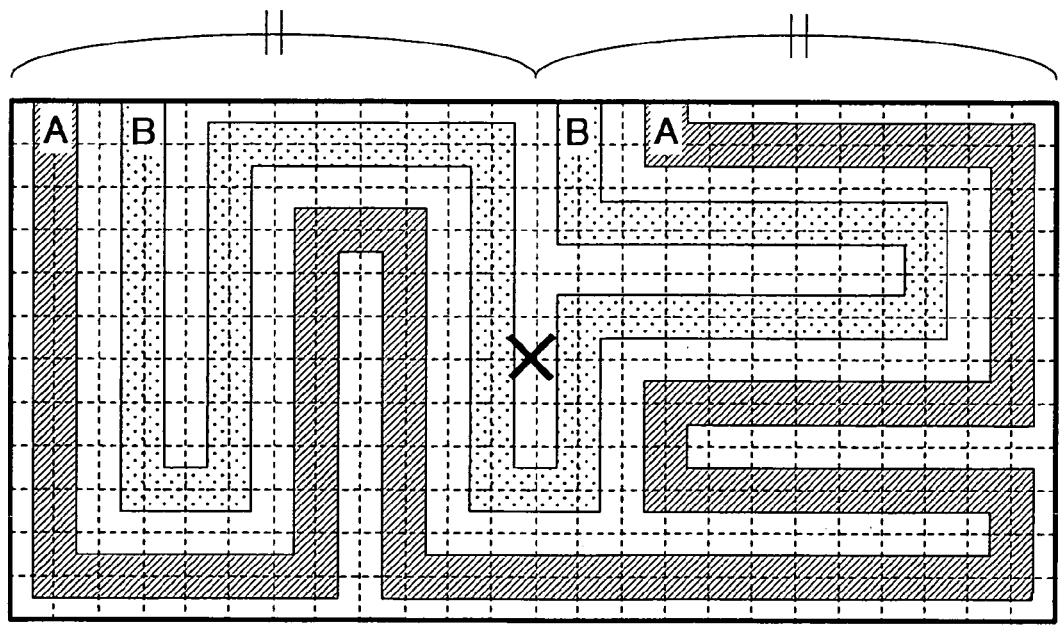
FIG. 10 shows an example of an edge cell.

Then, edge cells for basic cells of 90°-wiring arrangement types (1) and (2) are generated. An edge cell is a pattern for turn-around connection at a wiring route edge portion of a shielding line, and an example thereof is shown in FIG. 10. The edge cell is generated according to the following rule such that the density (distribution) of the wiring becomes uniform:
The shape and size of the pattern area of the edge cell, which is enclosed by the external boundary, are equal to those of the area of two wiring patterns (basic cells) arranged side by side;
All of the wiring intervals are equal;
The space between the wiring and the pattern external boundary is a ½ of the wiring interval; and
The origin point of the pattern is at the center of the area enclosed by the external boundary (symbol "x" of FIG. 10).

It should be noted that the rule value is determined based on the design rule according to the wiring occupancy rate, the capacity of a wiring prober, etc.

Figure 11:
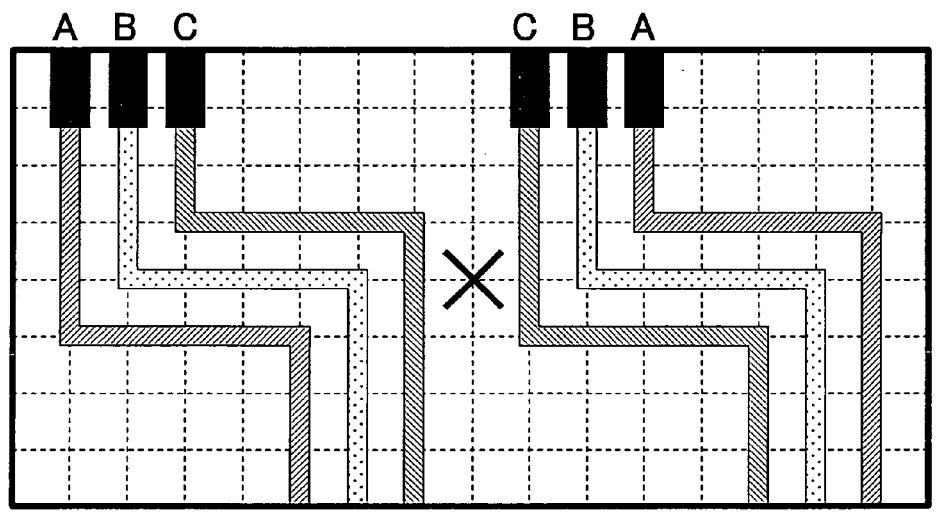
FIG. 11 illustrates a rule for determining a terminal position of an edge cell.

The positions of the terminals of the edge cell are determined according to the following rule:
The terminals of the edge cell is provided on one side of the edge cell at positions corresponding to the terminal positions of the wiring patterns (basic cells) arranged side-by-side; and
The terminals are provided in the same order from opposite ends towards the center (in FIG. 11, A→B→C·C←B←A).

Figure 12:
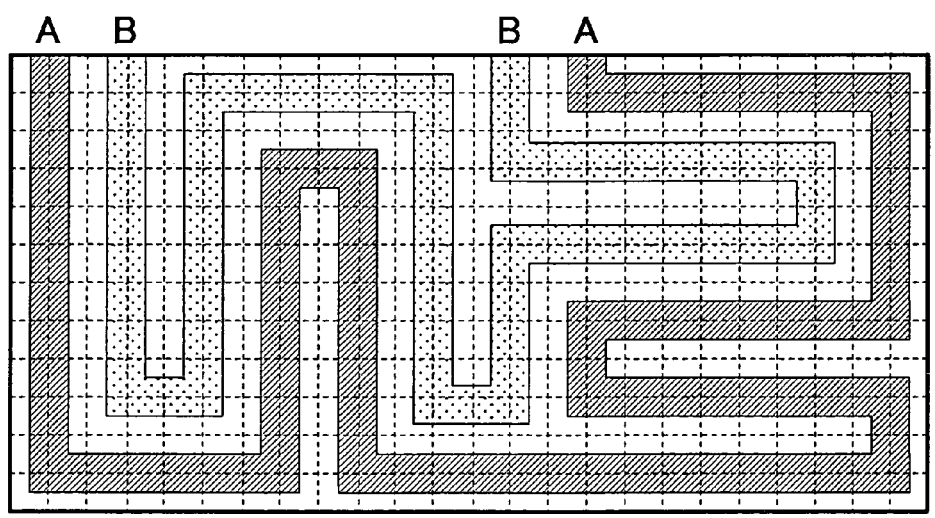
FIG. 12 shows an example of an edge cell of 90°-wiring arrangement type (1).
Figure 13:
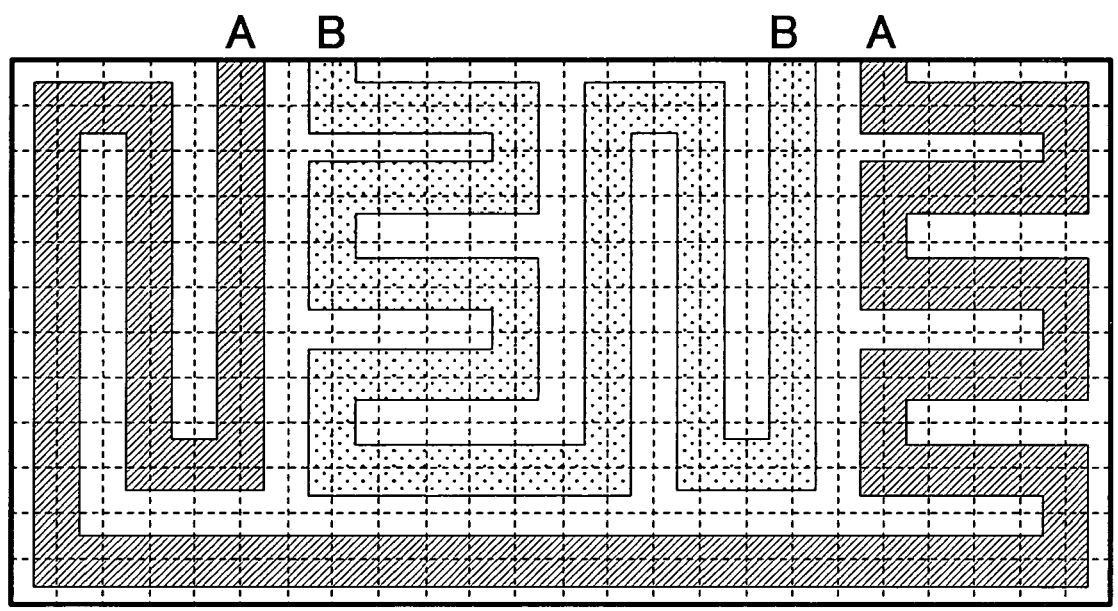
FIG. 13 shows an example of an edge cell of 90°-wiring arrangement type (2).

After the positions of the terminals have been determined, corresponding terminals having the same line names are connected by 90°-routes. As a result, one edge cell is generated. By the same process, a plurality of edge cells having different terminal positions and different wiring routes are generated. Examples of the thus-generated edge cells of 90°-wiring arrangement type (1) and 90°-wiring arrangement type (2) are shown in FIGS. 12 and 13, respectively.

<45°-Wiring Arrangement Type>

Figure 14:
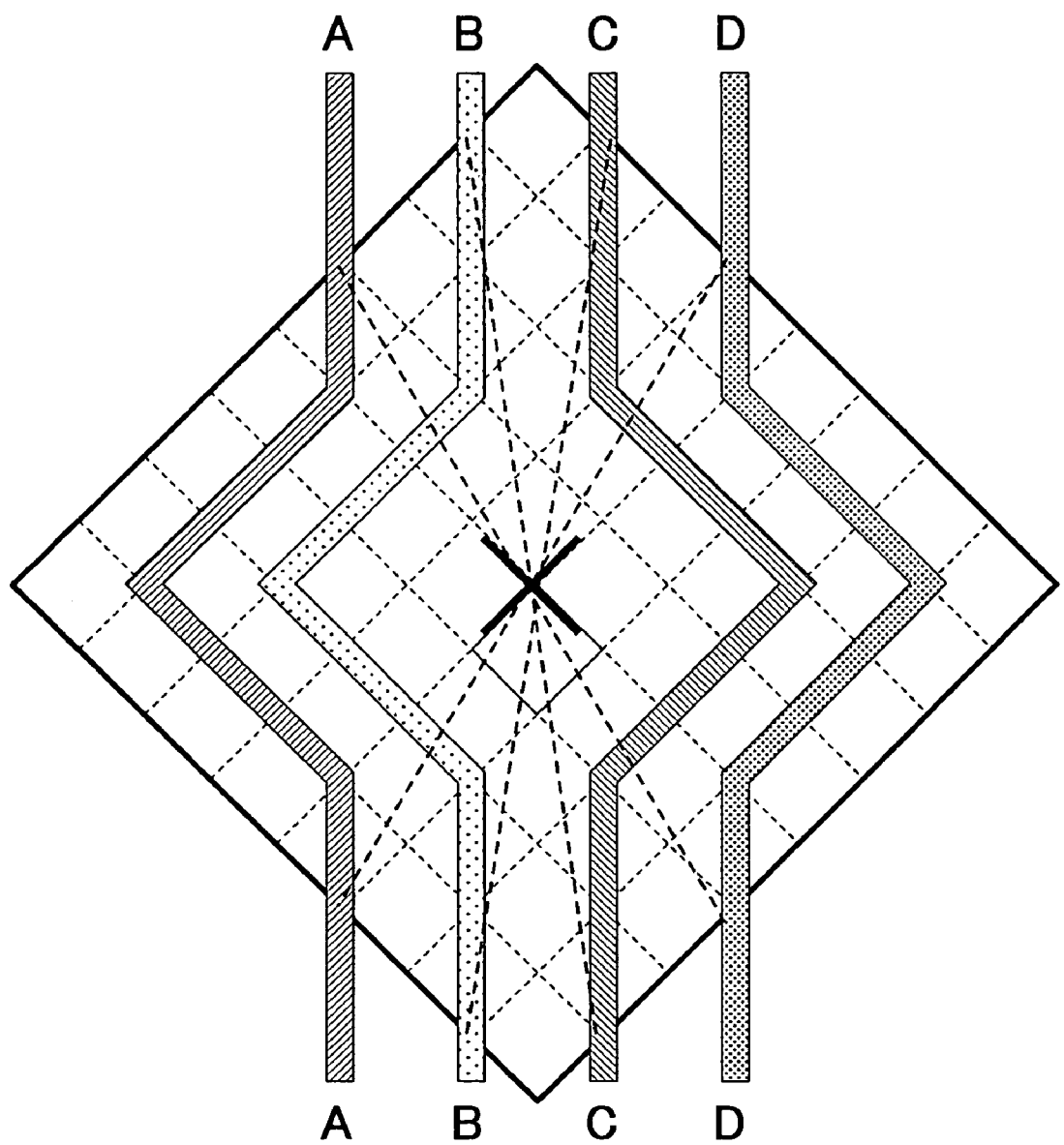
FIG. 14 illustrates a rule for determining a terminal position of a basic cell of 45°-wiring arrangement type.

In a 45°-wiring arrangement type cell, as shown in FIG. 14, the wiring route is formed by 45°-routes and 90°-routes (i.e., the wiring route runs in a direction which forms an angle of 45° or 90° with any one of the four edges of an LSI chip). The positions of the terminals are determined according to the following rule:
The inlet ends and outlet ends of wires are placed at symmetric positions with respect to the center of the pattern area (symbol "x" of FIG. 14), but the order of lines A, B, C and D at the inlet end is opposite to that at the outlet end.

Figure 15A:
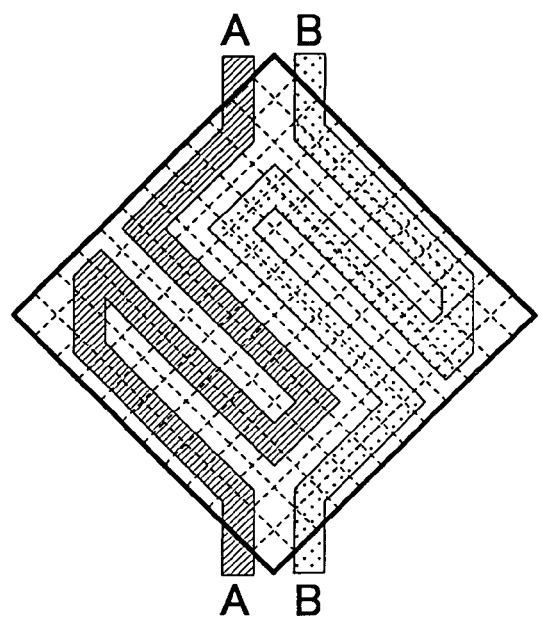
FIG. 15 shows an example of a basic cell of 45°-wiring arrangement type.
Figure 15B:
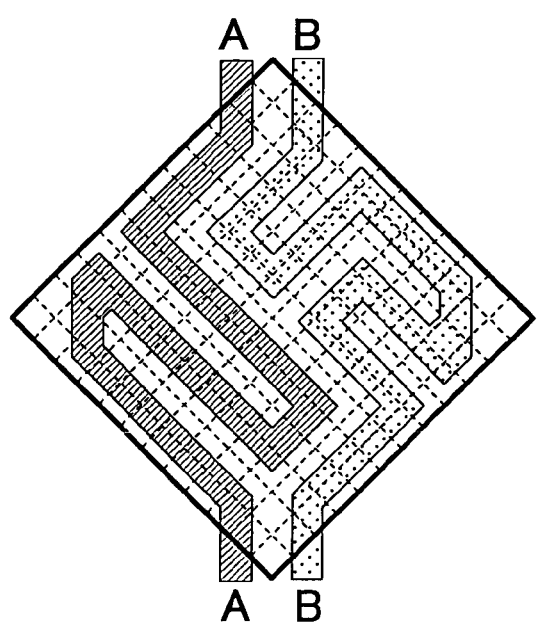
Figure 16A:
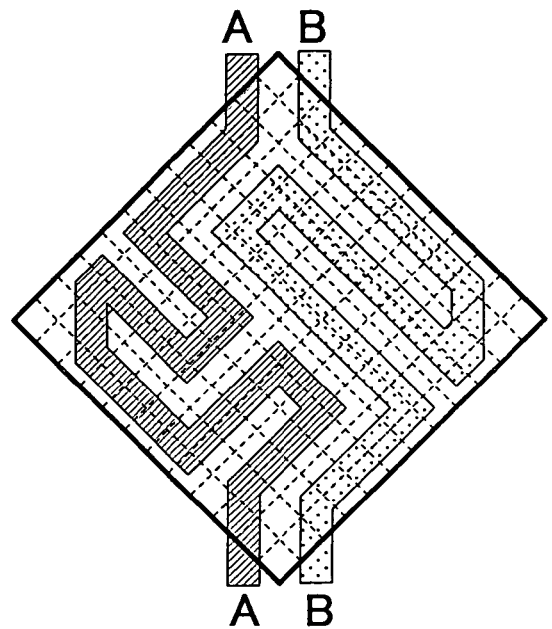
FIG. 16 shows another example of a basic cell of 45°-wiring arrangement type.
Figure 16B:
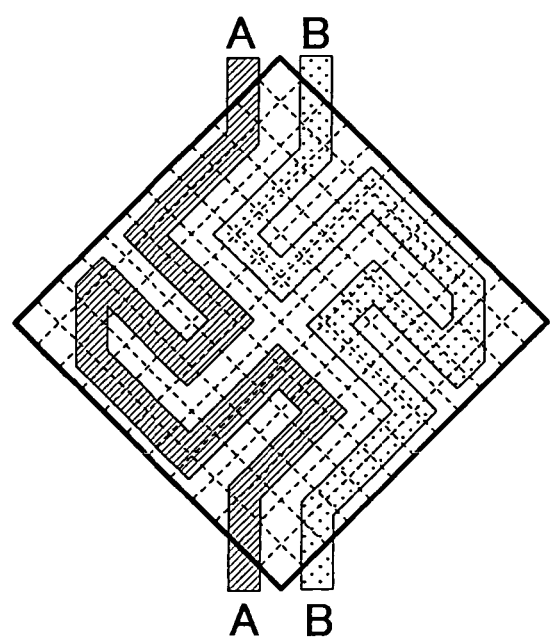
Figure 17:
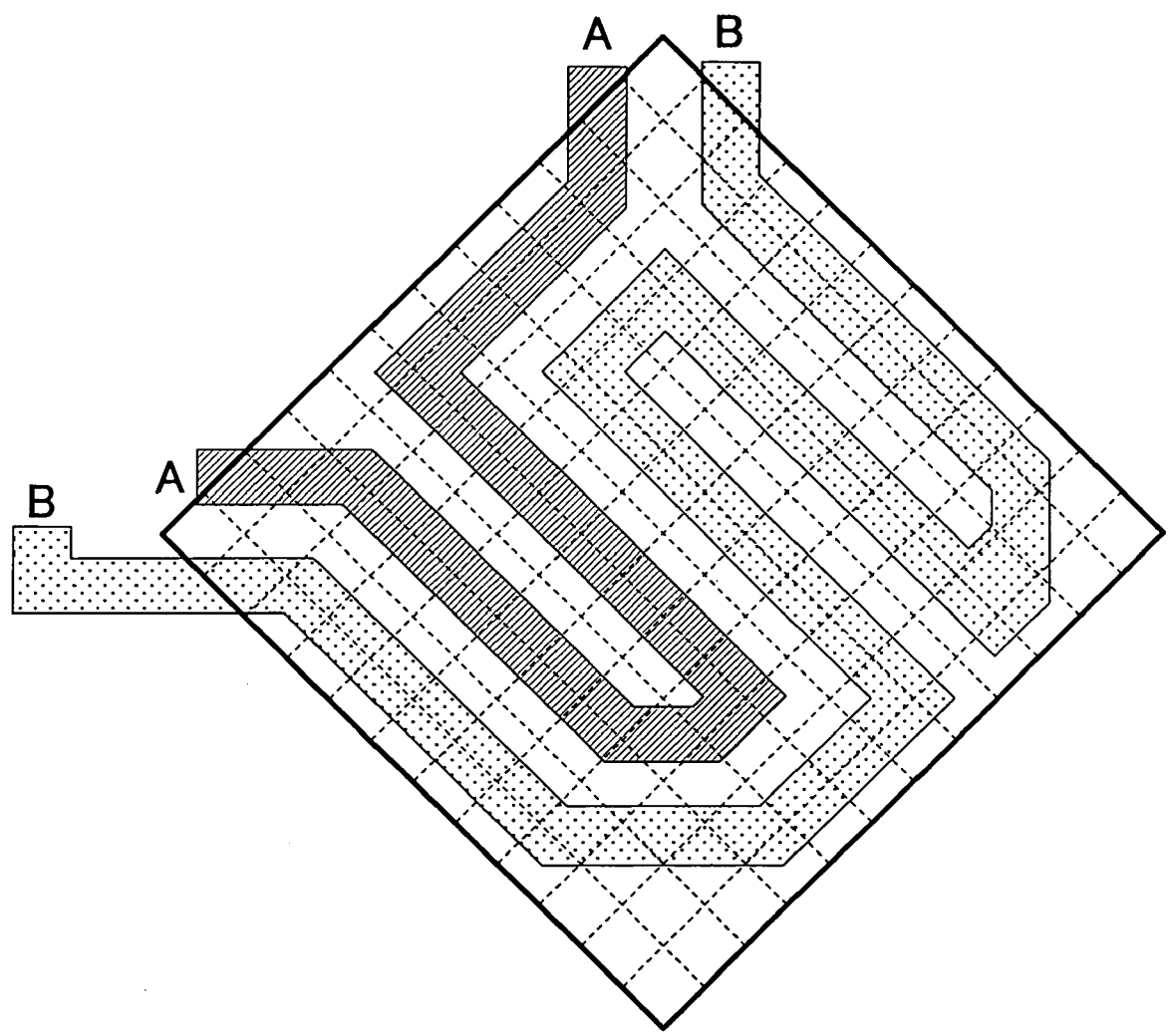
FIG. 17 shows an example of an edge cell of 45°-wiring arrangement type.

After the positions of the terminals have been determined, the inlet and the outlet for the same line are connected by 45°-routes and 90°-routes. As a result, one basic cell is generated. By the same process, a plurality of basic cells having different terminal positions and different wiring routes are generated. Examples of the thus-generated basic cells of 45°-wiring arrangement type are shown in FIGS. 15 and 16. An example of the edge cell of 45°-wiring arrangement type is shown in FIG. 17.

<Selection of Basic Cell Type (ST200)>

After the plurality of basic cells and edge cells have been generated for each type, the type of the basic cell used for a shielding line is selected.

<Arrangement of Basic Cells and Edge Cells (ST300)>

The basic cells and edge cells are arranged based on the arrangement rule which differs according to the type of a selected basic cell. Hereinafter, arrangement of the cells is specifically described.

<Arrangement Method for Basic Cells and Edge Cells of 90°-Wiring Arrangement Type (1)>

(1) Arrangement of Wiring Patterns (Basic Cells)

Figure 18A:
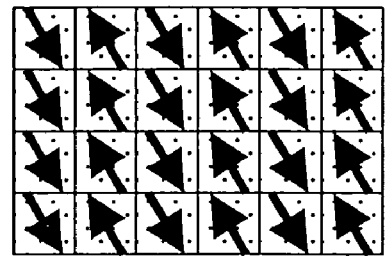
FIG. 18 illustrates a method for arranging basic cells and edge cells of 90°-wiring arrangement type (1).

The wiring patterns are placed all over a shield region at the pitch of the external boundary of the wiring patterns (see FIG. 18A). In this step, the wiring patterns are selected on a random basis.

(2) Rearrangement of Wiring Patterns (Basic Cells)

Figure 18B:
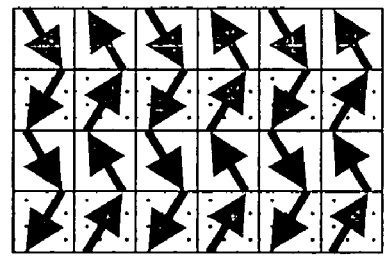

Among the above arranged wiring patterns, the wiring patterns of odd-numbered rows from the bottom are each inverted with respect to the Y-axis including its origin point. As a result of the inversion, a plurality of vertical wiring routes are obtained (see FIG. 18B).

(3) Arrangement of Edge Patterns (Edge Cells)

Figure 18C:
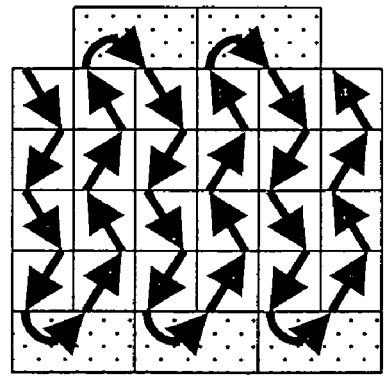
Figure 18D:
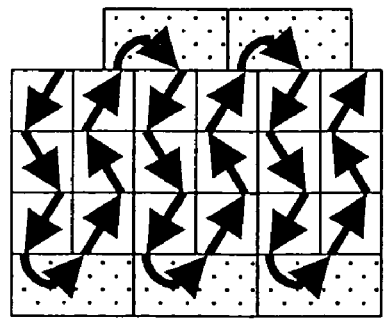

At the bottom of the arrangement region, edge patterns are arranged horizontally in a row at the pitch of the external boundary of the edge pattern. In this step, the edge patterns are selected on a random basis. At the top of the arrangement region, inverted (upside down) edge patterns are arranged horizontally in a row at the pitch of the external boundary of the edge pattern. In this step, the edge patterns are also selected on a random basis. If there are even-numbered rows of wiring patterns, the edge patterns of the uppermost row are horizontally shifted by the width of one wiring pattern (see FIG. 18C). If there are odd-numbered rows of wiring patterns, the edge patterns of the uppermost row are horizontally shifted by the width of one and a half wiring pattern (see FIG. 18D).

Figure 19:
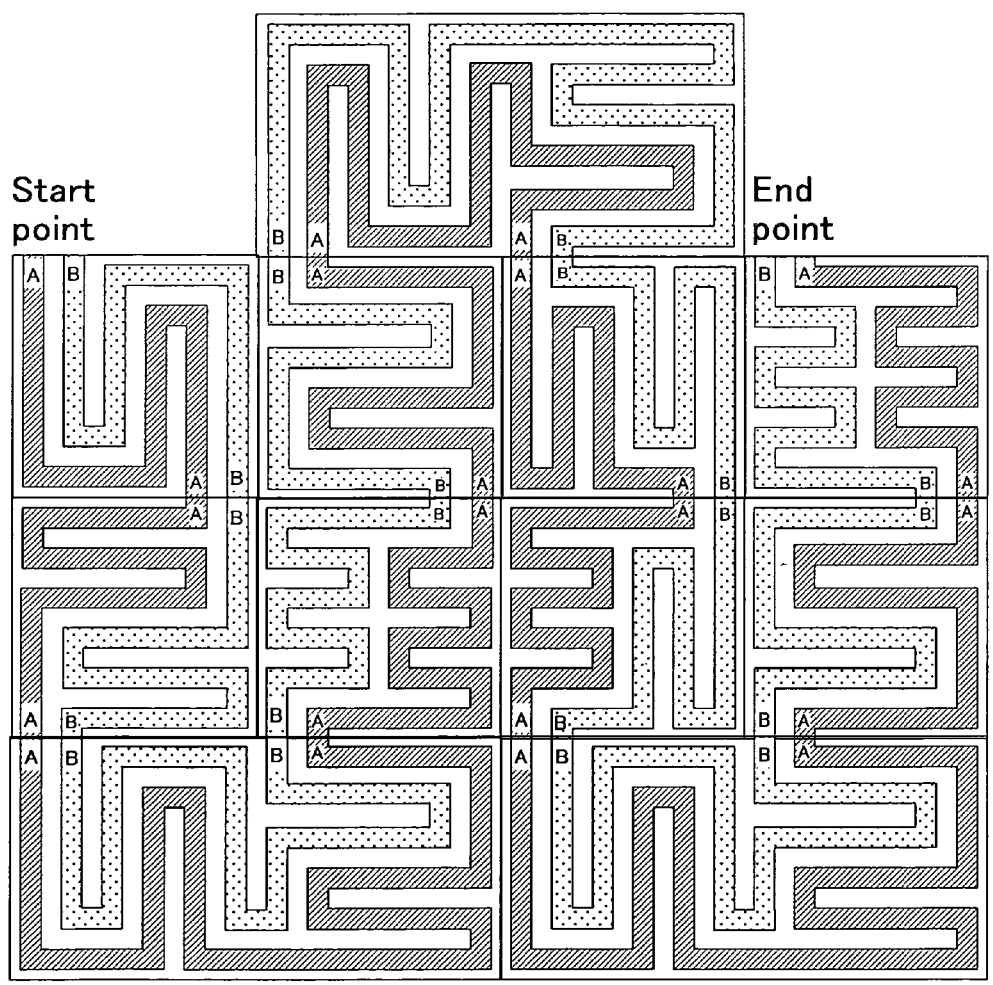
FIG. 19 shows an example of shielding lines arranged according to the method for arranging basic cells and edge cells of 90°-wiring arrangement type (1).

An example of the thus-arranged shielding line is shown in FIG. 19.

<Arrangement Method for Basic Cells and Edge Cells of 90°-Wiring Arrangement type (2)>

(1) Arrangement of Wiring Patterns (Basic Cells)

Figure 20A:
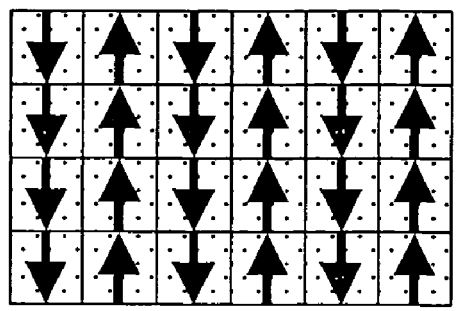
FIG. 20 illustrates a method for arranging basic cells and edge cells of 90°-wiring arrangement type (2).

The wiring patterns are placed all over a shield region at the pitch of the external boundary of the wiring patterns. In this step, the wiring patterns are selected on a random basis. The wiring patterns are inverted with respect to the Y-axis including the origin point of each pattern on a random basis. As a result of the arrangement, a plurality of vertical wiring routes are obtained (see FIG. 20A).

(2) Arrangement of Edge Patterns (Edge Cells)

Figure 20B:
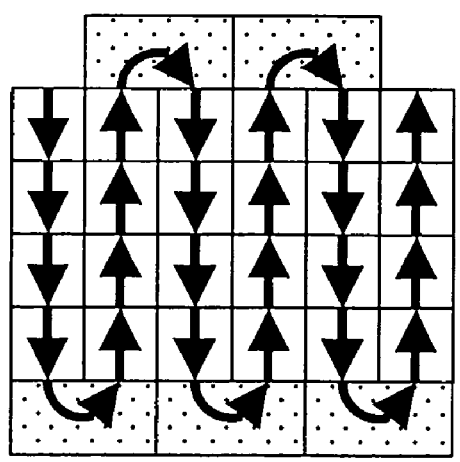

At the bottom of the arrangement region, edge patterns are arranged horizontally in a row at the pitch of the external boundary of the edge pattern. In this step, the edge patterns are selected on a random basis. At the top of the arrangement region, inverted (upside down) edge patterns are arranged horizontally in a row at the pitch of the external boundary of the edge pattern, while the edge patterns are horizontally shifted by the width of one wiring pattern. In this step, the edge patterns are selected on a random basis (see FIG. 20B).

Figure 21:
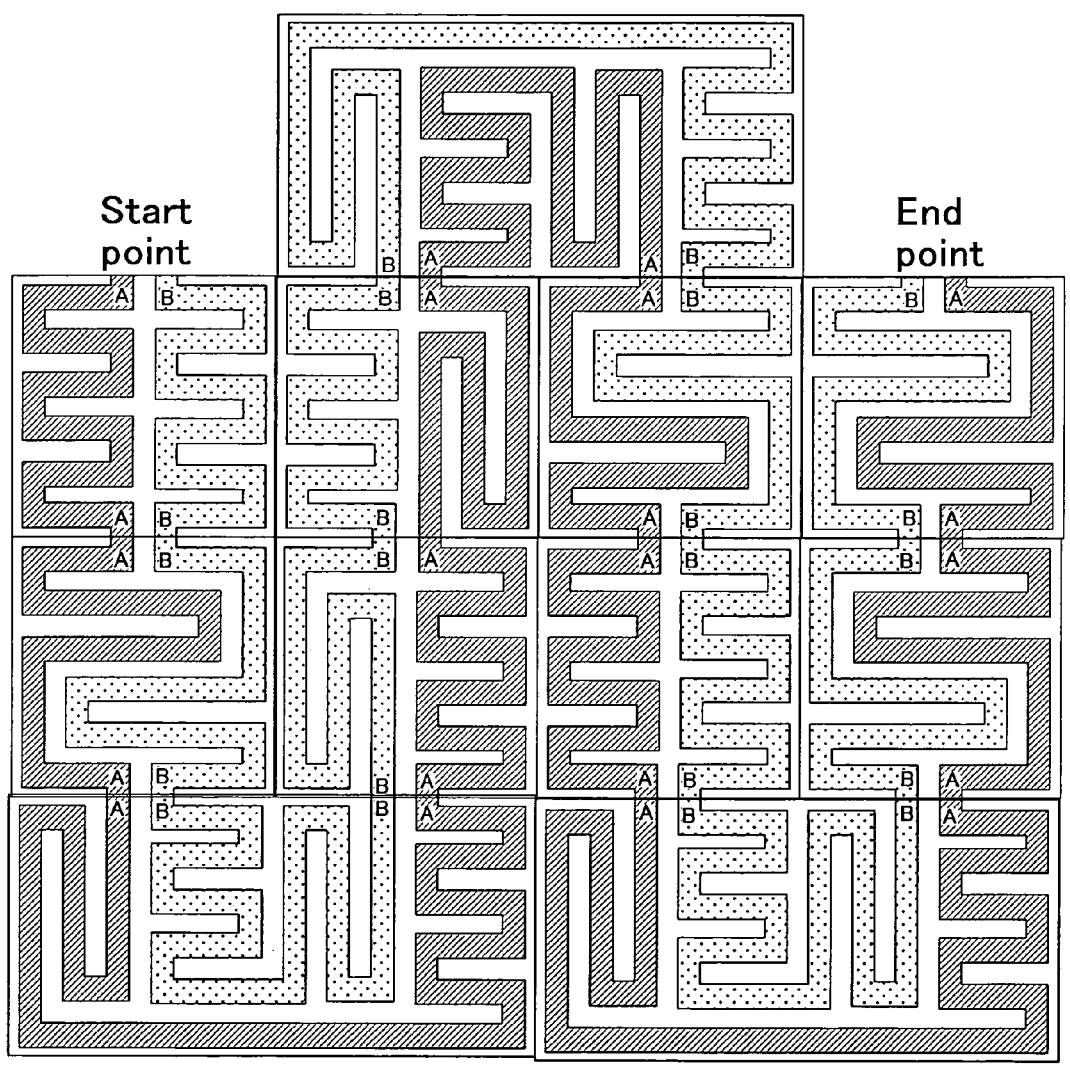
FIG. 21 shows an example of shielding lines arranged according to the method for arranging basic cells and edge cells of 90°-wiring arrangement type (2).

An example of the thus-arranged shielding line is shown in FIG. 21.

<Arrangement Method for Basic Cells and Edge Cells of 45°-Wiring Arrangement Type>

(1) Arrangement 1 of Wiring Patterns (Basic Cells)

Figure 22A:
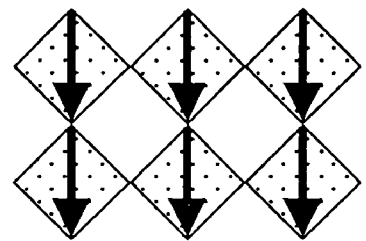
FIG. 22 illustrates a method for arranging basic cells and edge cells of 45°-wiring arrangement type.

The wiring patterns are placed all over a shield region at the pitch of the external boundary of the wiring patterns. In this step, the wiring patterns are selected on a random basis. The wiring patterns are inverted with respect to the Y-axis including the origin point of each pattern on a random basis (see FIG. 22A).

(2) Arrangement 2 of Wiring Patterns (Basic Cells)

Figure 22B:
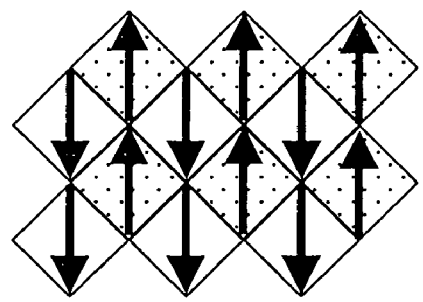

The arrangement start position is shifted both vertically and horizontally by a ½ of the size of the external boundary of the wiring pattern from the arrangement start position of arrangement 1. The same number of wiring patterns as those used in arrangement 1 are arranged at the pitch of the external boundary of the wiring patterns. The arranged wiring patterns are inverted with respect to the Y-axis including the origin point of each pattern on a random basis. In this step, the wiring patterns are selected on a random basis. As a result of the arrangement, a plurality of vertical wiring routes are obtained (see FIG. 22B).

(3) Arrangement of Edge Patterns (Edge Cells)

Figure 22C:
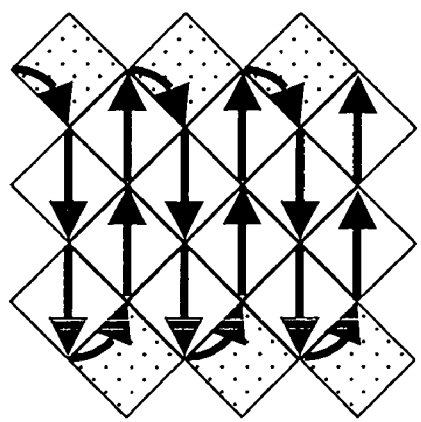

The arrangement start position is shifted horizontally by a ½ of the size of the external boundary of the edge pattern from the arrangement start position of arrangement 1, and the edge patterns are arranged horizontally in a row at the pitch of the external boundary of the wiring patterns. In this step, the edge patterns are selected on a random basis. At the top of the arrangement region, inverted (upside down) edge patterns are arranged horizontally in a row at the pitch of the external boundary of the edge pattern. In this step, the edge patterns are selected on a random basis. The arrangement positions are horizontally shifted according to the number of rows of wiring patterns (see FIG. 22C).

Figure 23:
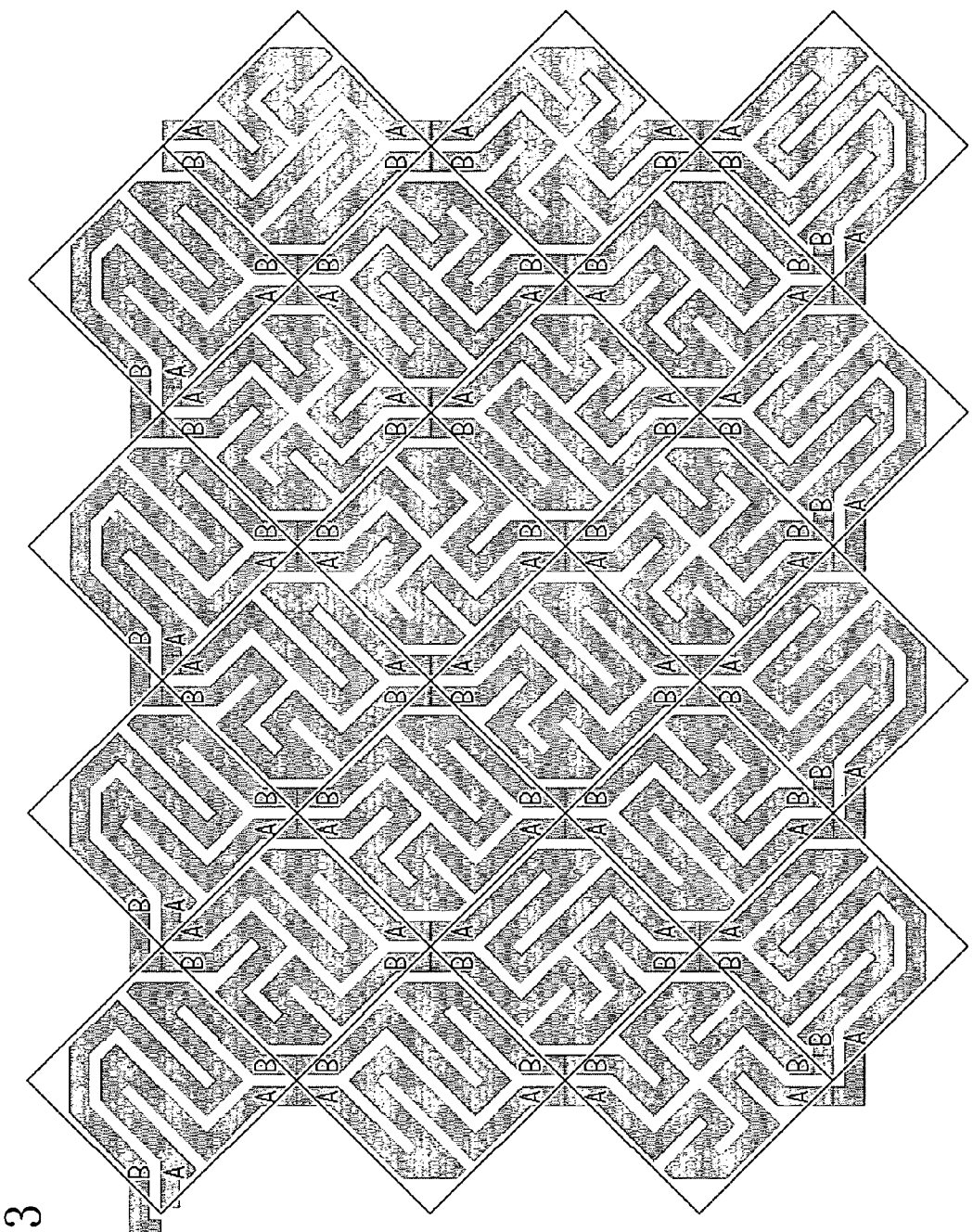
FIG. 23 shows an example of shielding lines arranged according to the method for arranging basic cells and edge cells of 45°-wiring arrangement type.

An example of the thus-arranged shielding line is shown in FIG. 23.

Figure 24A:
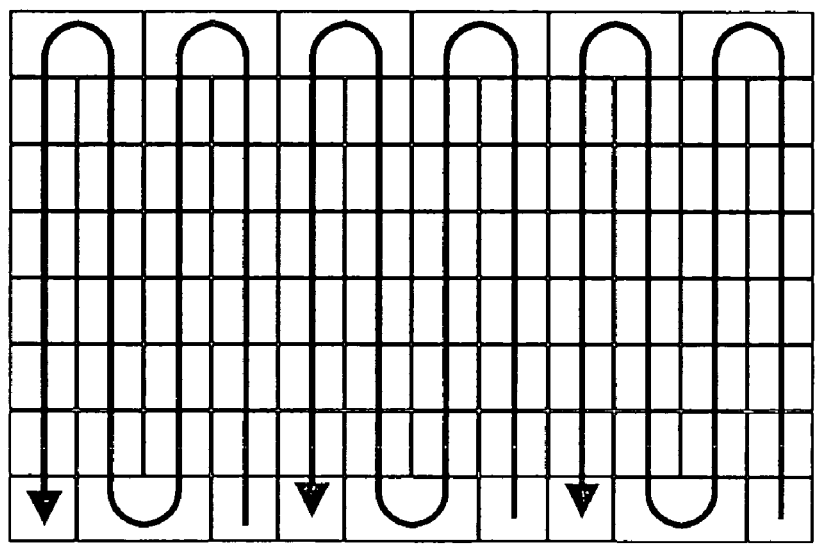
FIG. 24 shows an example of a wiring route which can be achieved by ingeniously determining the insertion position of an edge pattern (edge cell).
Figure 24B:
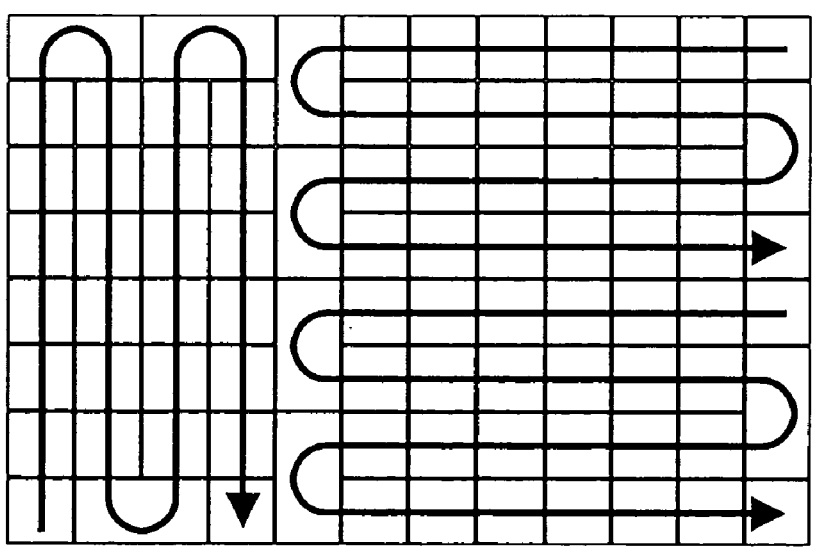
Figure 25A:
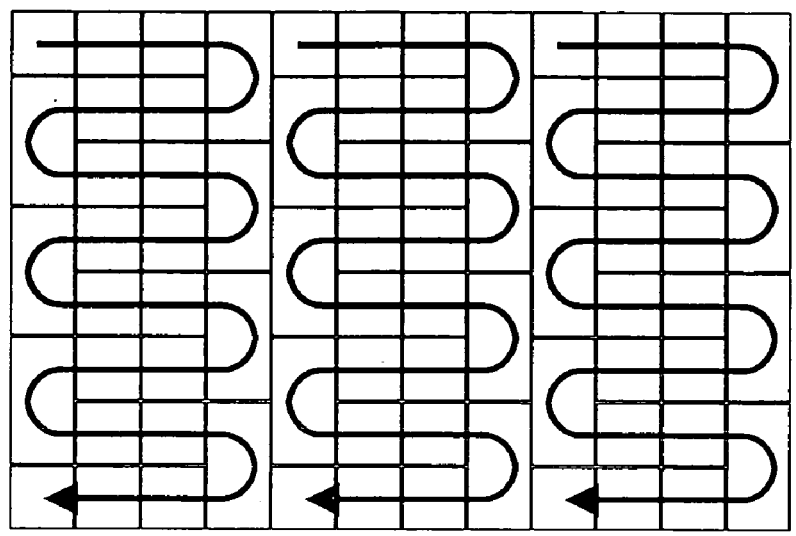
FIG. 25 shows another example of a wiring route which can be achieved by ingeniously determining the insertion position of an edge pattern (edge cell).
Figure 25B:
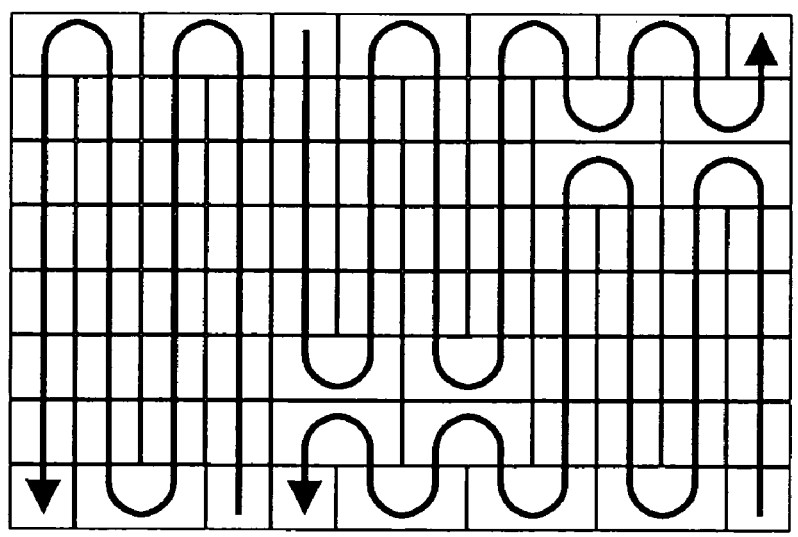

By ingeniously determining the insertion positions of the edge patterns (edge cells) in the above-described arrangement method, complicated wiring routes are obtained as shown in FIGS. 24 and 25.

Embodiment 2

The general procedure of the shielding line arrangement method of embodiment 2 is the same as that illustrated in FIG. 1. In embodiment 2, basic cells are arranged to form a plurality of constantly-parallel routes, and edge cells are arranged such that the same route is not adjacently provided (i.e., a route does not adjoin itself). Even if circuit analysis is committed with a probe against a circuit line in a shielding line removed region, the above structure of embodiment 2 doubles the processing time required for analysis in a region including two or more routes of shielding lines. Accordingly, the processing difficulty increases. This feature is specifically described below.

<Generation of Basic Cells and Edge Cells (ST100)>

First, a design rule of a basic cell which is a basic unit of the shielding line is described. Herein, the following design rule is provided for obtaining uniform wiring density:

External boundary of a basic cell is rectangular;

In the uppermost wiring layer, wires extend straight in parallel with each other;

The space between the wiring and the external basic cell boundary is a ½ of the wiring interval; and Terminals are positioned on opposite sides of the external boundary of a pattern such that a terminal provided on one side is connected to a terminal provided on the other side by wiring.

It should be noted that the wiring interval is determined based on the design rule according to the wiring occupancy rate, the capacity of a wiring prober, etc.

Figure 26A:
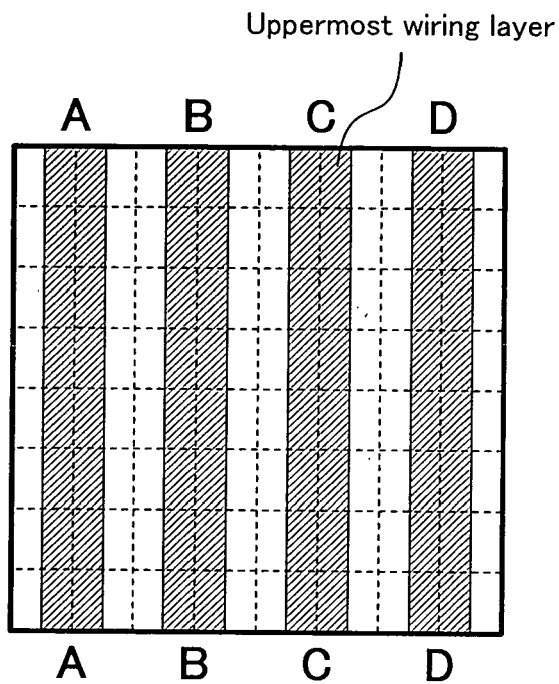
FIG. 26 shows an example of a basic cell.
Figure 26B:
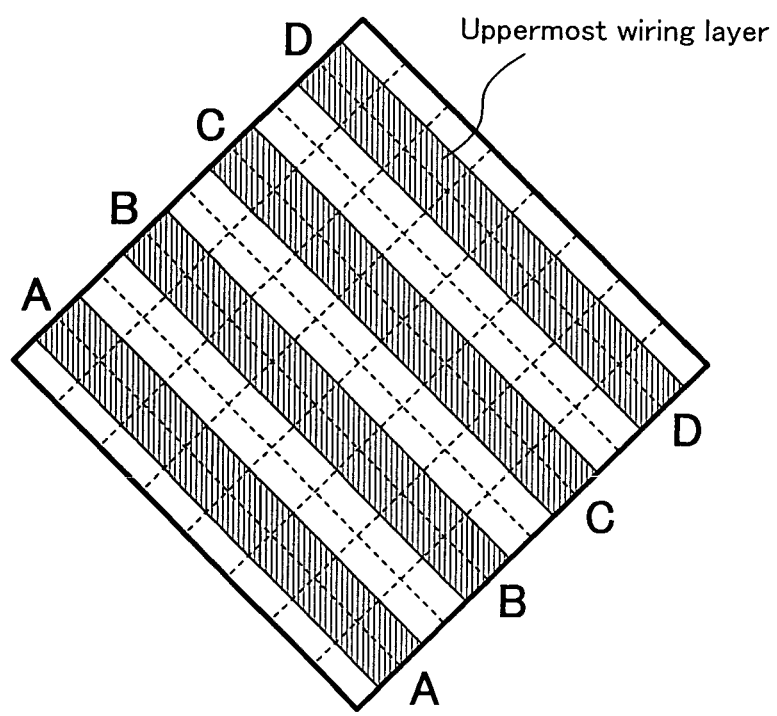

Basic cells are generated according to the above rule. Herein, two types of basic cells, type (1) and type (2), are generated. The type (1) basic cell is formed by routes of 90° with respect to any one of the four edges of a chip as shown in FIG. 26A. The type (2) basic cell is formed by routes of 45° with respect to any one of the four edges of a chip as shown in FIG. 26B.

Then, edge cells for turn-around connection at a wiring route edge portion are generated. An edge cell is a pattern for turn-around connection at a wiring route edge portion. The edge cell is generated according to the following design rule: The shape and size of the pattern area of the edge cell, which is enclosed by the external boundary, are equal to those of the area of two basic cells arranged side by side;

The wires are arranged using the uppermost wiring layer, an underlying wiring layer, and contacts for connecting the uppermost wiring layer and the underlying wiring layer such that a route does not adjoin itself in a turn-around region;

The space between the uppermost wiring layer and the basic cell external boundary is a ½ of the wiring interval in the uppermost wiring layer; and The terminals of the edge cell are provided only on one side of the edge cell at positions corresponding to the terminal positions of the two basic cells arranged side-by-side.

It should be noted that the wiring interval is determined based on the design rule according to the wiring occupancy rate, the capacity of a wiring prober, etc.

Figure 27A:
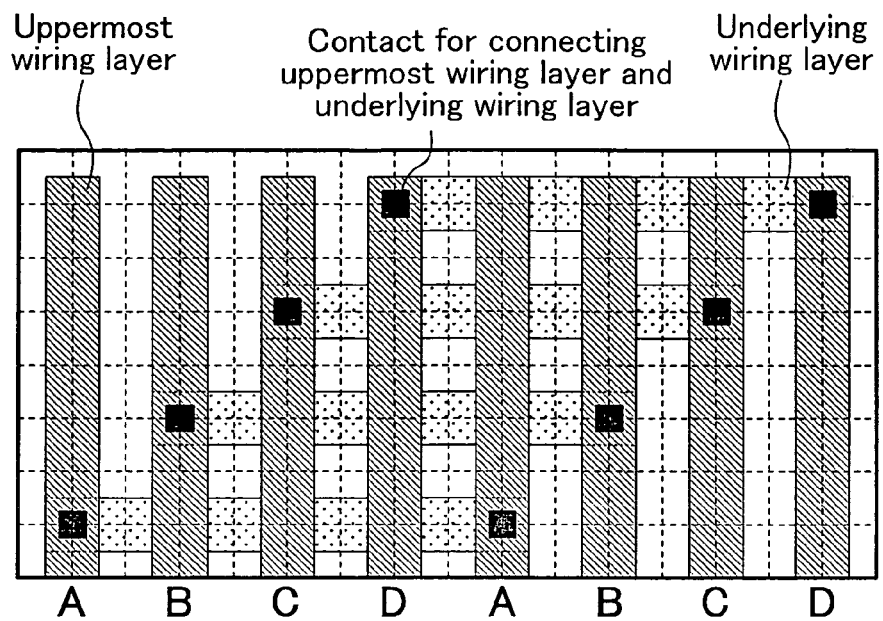
FIG. 27 shows an example of an edge cell.
Figure 27B:
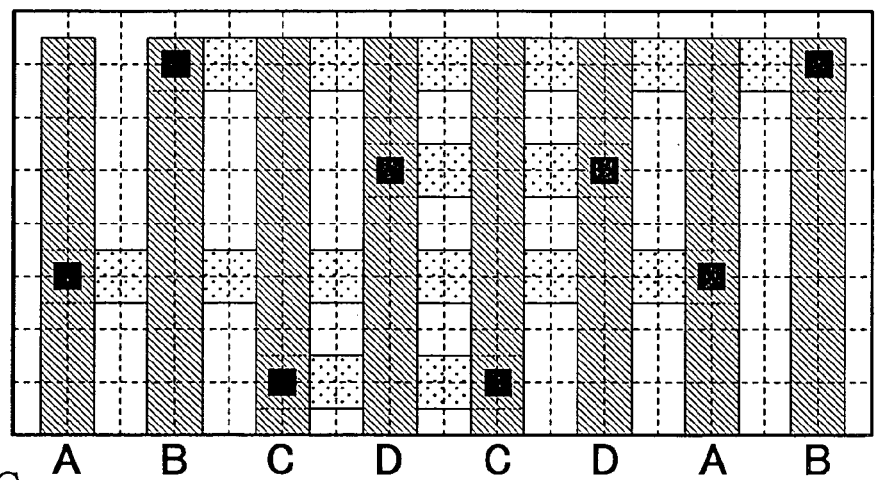
Figure 27C:
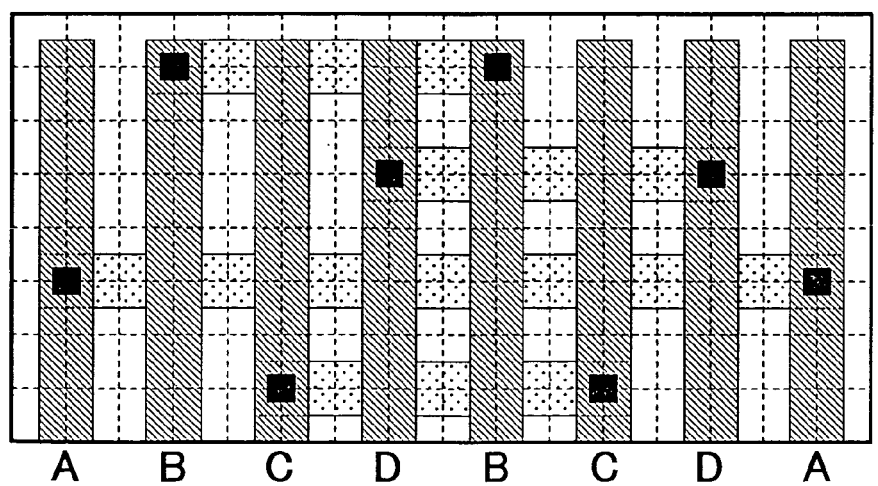

Examples of the edge cell generated according to the above-described rule are shown in FIGS. 27A to 27C. In these edge cells, each terminal is connected to any one of the other terminals except for an adjacent terminal(s) by the underlying wiring layer and the contacts. The edge cells shown in FIGS. 27A to 27C have different relationships of connection between terminals.

<Selection of Basic Cell Type (ST200)>

After the plurality of basic cells and edge cells have been generated for each type, the type of the basic cell used for a shielding line is selected.

<Arrangement of Basic Cells and Edge Cells (ST300)>

Figure 28A:
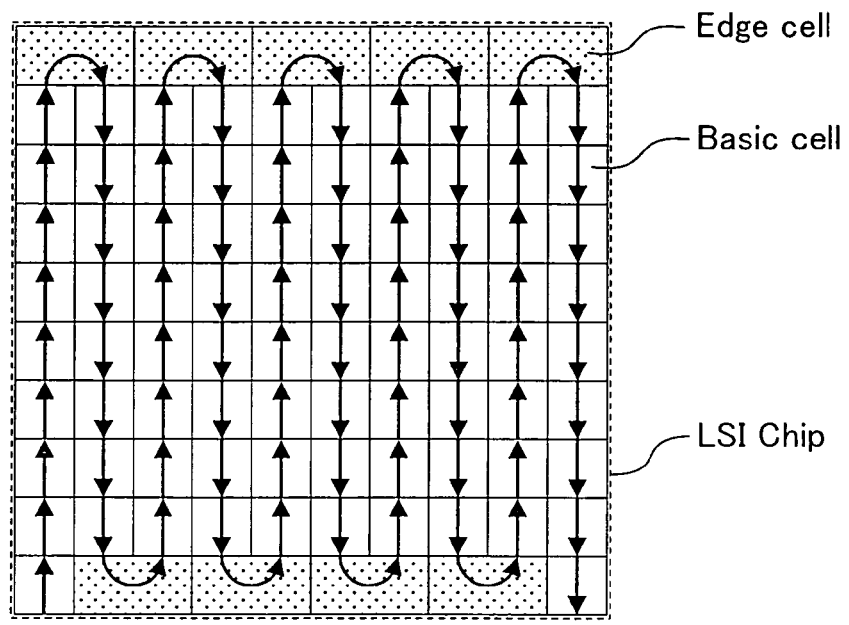
FIG. 28 shows an example of a cell sequence arranged according to the method for arranging basic cells and edge cells of embodiment 2.
Figure 28B:
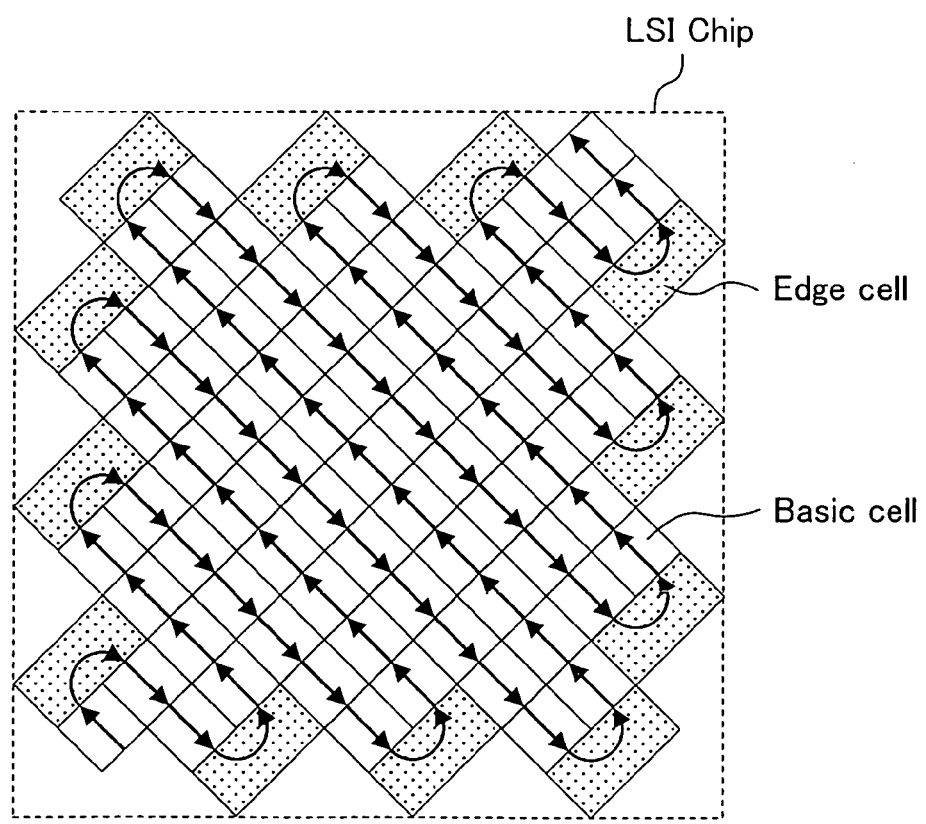

First, the selected basic cells are placed all over a shield region at the pitch of the external boundary of the basic cells. Then, the selected edge cells are provided at the edges except for the start point and end point of a shielding line such that the sides having terminals abut each other. Examples of the thus-arranged cell sequence are shown in FIGS. 28A and 28B. FIG. 28A is an example where basic cells of type (1) and edge cells are arranged. FIG. 28B is an example where basic cells of type (2) and edge cells are arranged.

Figure 29A:
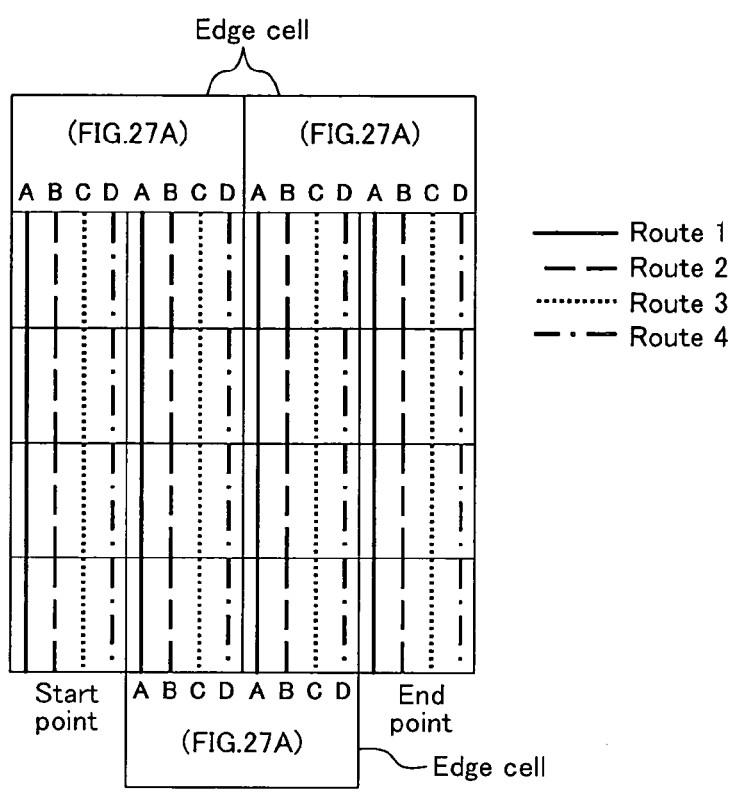
FIG. 29 shows an example of shielding line routes arranged according to the method for arranging basic cells and edge cells of embodiment 2.

An example of the thus-arranged shielding line route is shown in FIG. 29A. In this way, the edge cells for turn-around connection where any route does not adjoin itself are provided, whereby even if circuit analysis is committed with a probe against a circuit line in a shielding line removed region, the processing time required for analysis in a region including two or more routes of shielding lines is doubled. Accordingly, the processing difficulty increases.

Figure 29B:
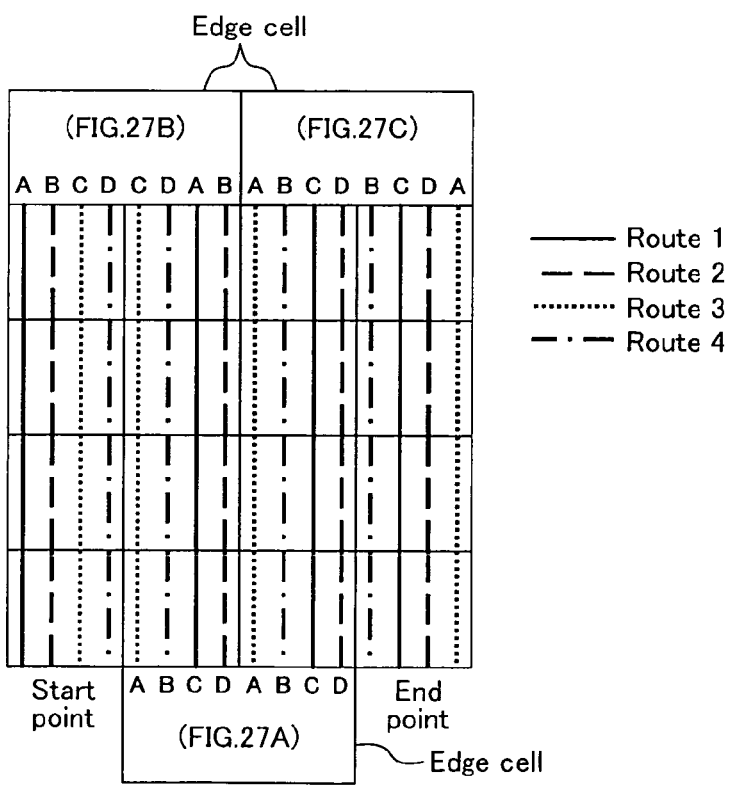

In the example shown in FIG. 29A, only the edge cells having the same relationship of connection between terminals (herein, the type shown in FIG. 27A) are used. Therefore, the wiring of the uppermost layer includes routes in a regular order, route 1, route 2, route 3, route 4, route 1, route 2, route 3, route 4, . . . . On the other hand, in the example shown in FIG. 29B, the edge cells having different relationships of connection between terminals (herein, the type shown in FIG. 27A, the type shown in FIG. 27B and the type shown in FIG. 27C) are used. Therefore, the wiring of the uppermost layer includes routes in an irregular order, route 1, route 2, route 3, route 4, route 3, route 4, route 1, route 2, . . . . In this way, a plurality of edge cells having different relationships of connection between terminals are used, whereby a shielding line route having less regularity is formed although the wiring of the uppermost layer has a regular pattern (a plurality of straight wires extend in parallel with each other). Thus, the difficulty level of circuit analysis increases.

Embodiment 3

Figure 30:
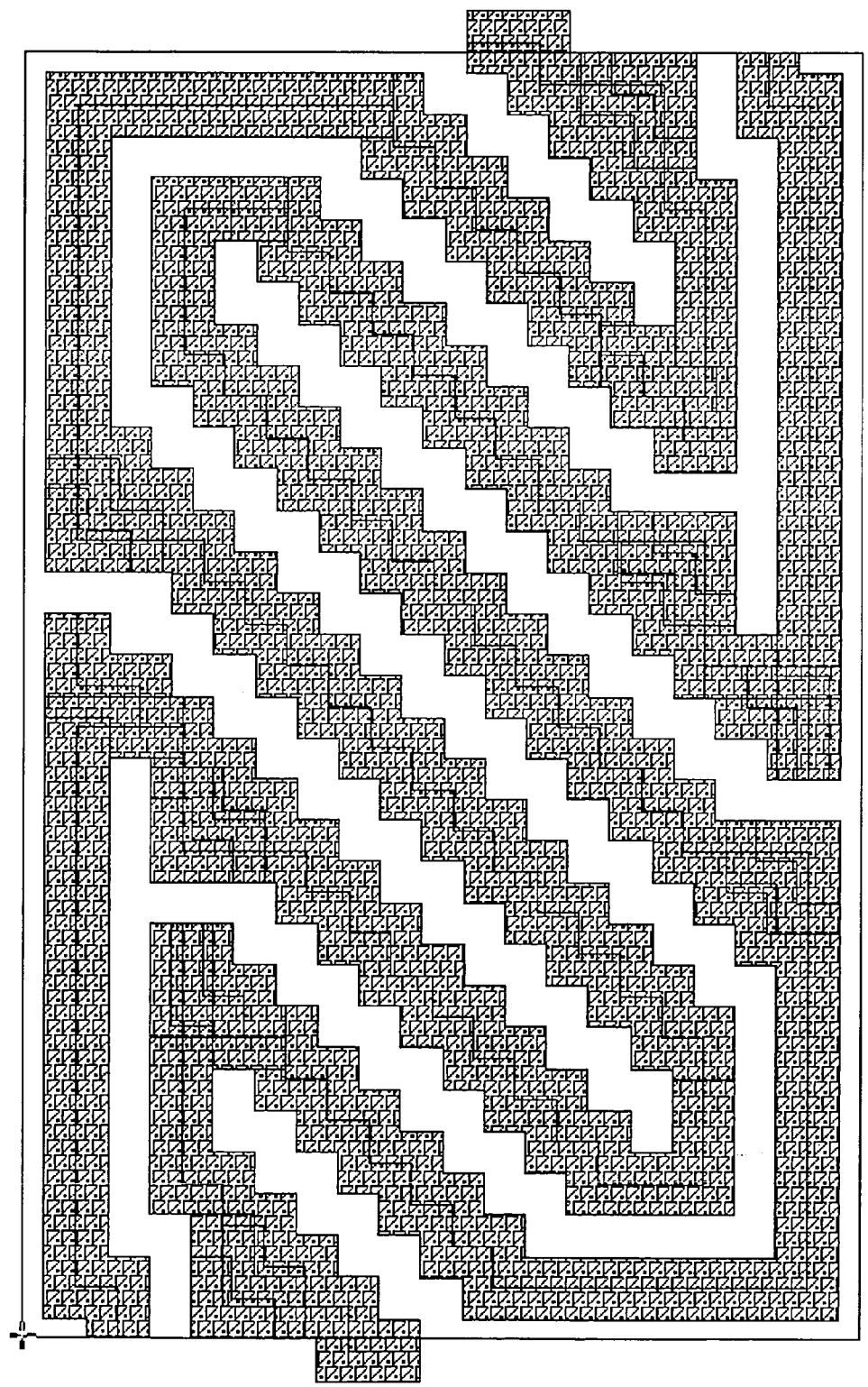
FIG. 30 shows the structure of a basic cell according to embodiment 3.

The structure of a basic cell according to embodiment 3 is shown in FIG. 30. In this basic cell, a 45°-route of the common 45°-wiring arrangement type basic cell illustrated in embodiments 1 and 2 is realized by a stepped route of 90°, whereby the difficulty level of treatment and processing of edge portions for 45° is lowered. In this basic cell, a stepped portion appears to be smooth like a 45°-wire. Further, due to the stepped shape, the exposed area of the underlying layer is small as compared with a common 45°-route. Although in FIG. 30 the entirety of the 45°-routes is realized by stepped 90°-routes, only a part of the 45°-routes may be realized by a stepped 90°-route. The basic cells illustrated in FIG. 30 are placed all over the shield region as in embodiments 1 and 2, whereby shielding lines are realized.

Embodiment 4

Figure 31:
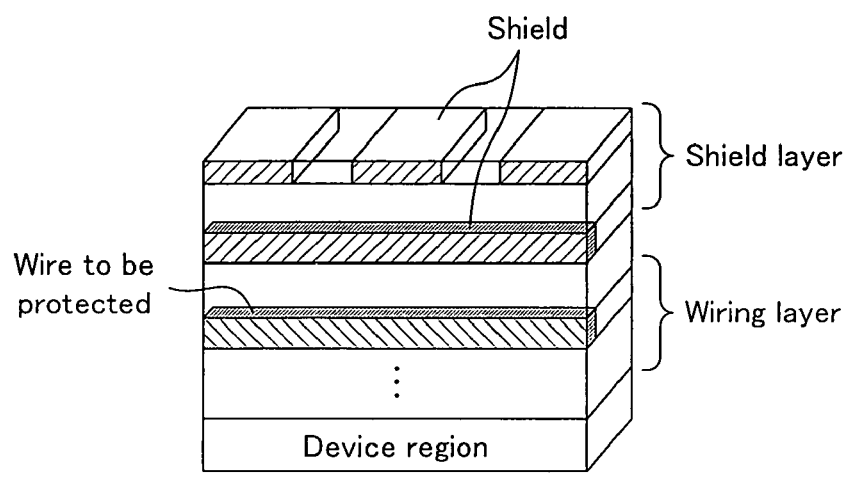
FIG. 31 shows a shield wiring structure according to embodiment 4.

A shielding line structure according to embodiment 4 is shown in FIG. 31. In this shielding line structure, a shielding line of an underlying layer is arranged to entirely cover a protection wiring. The direction of a shielding line of an upper layer may be any direction. With such a shielding line structure, a wire(s) to be protected is entirely hidden, and this structure is difficult to distinguish from a one-layer shield. Further, in the case where a wire(s) to be protected is an important wire(s), the cost is suppressed, and a circuit cannot be formed if a shield of the underlying layer is peeled.

Embodiment 5

Figure 32:
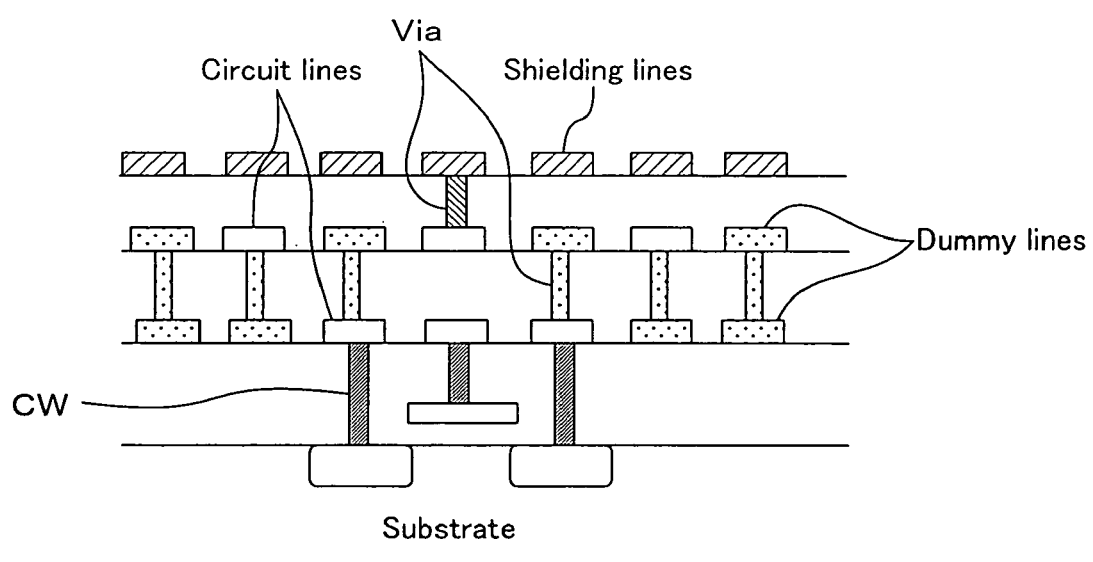
FIG. 32 shows a shield wiring structure according to embodiment 5.

A shielding line structure according to embodiment 5 is shown in FIG. 32. In this shielding line structure, the uppermost layer is a shielding line layer, in which circuit wires are mixedly included in some portions (up to the upper limit of the area ratio). Dummy lines are automatically inserted in free spaces of intermediate layers (up to the upper limit of the area ratio of each layer). The dummy lines and lines of underlying layers are connected to form wiring bridges in some portions. With such a shielding line structure, a layer entirely covered with wires appears below no matter which layer is peeled. Further, circuit formation is further corrupted as more wires are peeled. Thus, analysis is more difficult.

INDUSTRIAL APPLICABILITY

The present invention is applicable to arrangement of shielding lines for protecting from a fraudulent activity, such as copying, tampering, and the like, a semiconductor chip in which high confidentiality and secrecy are required for circuit information and internal information.

What is claimed is:

1. A basic cell, comprising a plurality of wires which constitute a wiring route of 90°, one ends of the plurality of wires being on one of opposite sides, and the other ends of the plurality of wires being on the other one of the opposite sides, wherein:
   each of the one ends of the plurality of wires is point-symmetric to any of the other ends of the plurality of wires with respect to the center of the area of the basic cell; and
   routes of the plurality of wires do not cross one another.

2. A wiring method, comprising the steps of:
   preparing a plurality of basic cells of claim 1, the basic cells having different wiring routes; and
   arranging the prepared basic cells such that one ends or the other ends of a plurality of wires included in one of the prepared basic cells abut one ends or the other ends of a plurality of wires included in another one of the prepared basic cells, thereby forming a wiring.

3. The wiring method of claim 2, wherein the wiring pattern of every other one of a plurality of basic cells arranged in a row direction is inverted with respect to the Y-axis including the origin point of the basic cell.

4. The wiring method of claim 2, wherein:
   one ends and the other ends of a plurality of wires are placed at symmetrical positions on one and the other of opposite sides; and
   the wiring pattern of any of the arranged basic cells is inverted with respect to the Y-axis including the origin point of the basic cell.

5. The wiring method of claim 2, wherein:
   if there are two or more rows of arranged basic cells, a turn-around connection is formed at a wiring route edge portion by using an edge cell;
   the edge cell functions as a pattern for turn-around connection at a wiring route edge portion, the edge cell including terminals arranged on only one side of the edge cell at positions corresponding to terminal positions of basic cells which are arranged side by side and connected to the edge cell;
   the arranged terminals are brought into correspondence with one another from both ends toward the center on a one-to-one basis; and
   a wire is provided in the form of a route of 90° between the corresponding terminals.

6. An edge cell functioning as a pattern for turn-around connection at a wiring route edge portion, comprising terminals arranged on only one side of the edge cell at positions corresponding to terminal positions of basic cells which are arranged side by side and connected to the edge cell, wherein:
   the arranged terminals are brought into correspondence with one another from both ends toward the center on a one-to-one basis; and
   a wire is provided in a form of a route of 90° between the corresponding terminals.

7. A basic cell, comprising a plurality of wires which constitute wiring routes of 45° and 90°, wherein:
   each of one ends of the wires is point-symmetric to any of the other ends of the wires with respect to the center of the area of the basic cell; and
   routes of the plurality of wires do not cross one another.

8. A wiring method, comprising the steps of:
   preparing a plurality of basic cells of claim 7, the basic cells having different wiring routes; and
   arranging the prepared plurality of basic cells such that one ends or the other ends of a plurality of wires included in one of the prepared plurality of basic cells abut one ends or the other ends of a plurality of wires included in another one of the prepared plurality of basic cells, thereby forming a wiring.

9. The wiring method of claim 8, wherein the wiring pattern of every other one of the plurality of basic cells arranged in a row direction is inverted with respect to the Y-axis including the origin point of the basic cell.

10. The wiring method of claim 8, wherein:
    one ends and the other ends of the plurality of wires are placed at symmetrical positions on one and the other of opposite sides; and
    the wiring pattern of any of the arranged basic cells is inverted with respect to the Y-axis including the origin point of the basic cell.

11. The wiring method of claim 8, wherein:
    if there are two or more rows of arranged basic cells, a turn-around connection is formed at a wiring route edge portion by using an edge cell;
    the edge cell functions as a pattern for turn-around connection at a wiring route edge portion, the edge cell including terminals arranged on only one side of the edge cell at positions corresponding to terminal positions of the basic cells which are arranged side by side and connected to the edge cell;
    the arranged terminals are brought into correspondence with one another from both ends toward the center on a one-to-one basis; and
    a wire is provided in the form of a route of 90° between the corresponding terminals.

12. A wiring structure of a shielding line, comprising:
    a first shielding line superposed entirely over a wiring to be protected; and
    a second shielding line formed in a layer overlying the first shielding line.

13. A wiring structure of a shielding line, comprising:
    a shielding line layer in which a circuit line is partially mixed, the shielding line layer being formed in the uppermost layer of a semiconductor device; and
    at least one intermediate layer in which a dummy line is inserted in a free space, the at least one intermediate layer being provided between a semiconductor substrate and the shielding line layer,
    wherein the dummy line is connected to a line in an underlying layer to form wiring bridges in some portions.

14. A wiring method, comprising the steps of:
    preparing a plurality of basic cells each of said basic cells comprising a plurality of wires which constitute a wiring route of 45° or 90°, one ends of the plurality of wires being on one of opposite sides, and the other ends of the plurality of wires being on the other one of the opposite sides, wherein:
    each of the plurality of the wires is formed by a straight route between one end and the other end; and
    the plurality of wires are parallel to each another; and
    arranging the prepared plurality of basic cells such that one ends or the other ends of a plurality of wires included in one of the prepared plurality of basic cells abut one ends or the other ends of a plurality of wires included in another one of the prepared plurality of basic cells, thereby forming a wiring.

15. The wiring method of claim 14, wherein:
  if there are two or more rows of arranged basic cells, a turn-around connection is formed at a wiring route edge portion by using one or a plurality of edge cells;
  the edge cell functions as a pattern for turn-around connection at a wiring route edge portion, the edge cell including terminals arranged on only one side of the edge cell at positions corresponding to terminal positions of the basic cells which are arranged side by side; and
  each of the terminals is connected to any one of the other arranged terminals except for an adjacent terminal.

16. The wiring method of claim 15, wherein the turn-around connection is formed at the wiring route edge portion using a plurality of edge cells having different relationships of connection between terminals.

17. An edge cell functioning as a pattern for turn-around connection at a wiring route edge portion, comprising terminals arranged on only one side of the edge cell at positions corresponding to terminal positions of a plurality basic cells which are arranged side by side, wherein each of the terminals is connected to any one of the other arranged terminals except for an adjacent terminal,
  wherein each of said basic cells comprises a plurality of wires which constitute a wiring route of 45° or 90°, one ends of the plurality of wires being on one of opposite sides, and the other ends of the plurality of wires being on the other one of the opposite sides,
  each of the plurality of the wires is formed by a straight route between one end and the other end; and
  the plurality of wires are parallel to each another.

* * * * *